(12) United States Patent
Obata

(10) Patent No.: US 12,550,348 B2
(45) Date of Patent: Feb. 10, 2026

(54) SEMICONDUCTOR DEVICE

(71) Applicant: FUJI ELECTRIC CO., LTD., Kanagawa (JP)

(72) Inventor: Tomoyuki Obata, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 726 days.

(21) Appl. No.: 17/948,258

(22) Filed: Sep. 20, 2022

(65) Prior Publication Data

US 2023/0019632 A1  Jan. 19, 2023

Related U.S. Application Data

(63) Continuation of application No. PCT/JP2021/038317, filed on Oct. 15, 2021.

(30) Foreign Application Priority Data

Oct. 16, 2020 (JP) ................. 2020-174399

(51) Int. Cl.
  *H10D 12/00* (2025.01)
  *H10D 62/10* (2025.01)
  *H10D 64/27* (2025.01)

(52) U.S. Cl.
  CPC ......... *H10D 12/481* (2025.01); *H10D 62/127* (2025.01); *H10D 64/513* (2025.01); *H10D 64/519* (2025.01)

(58) Field of Classification Search
  CPC .. H10D 12/481; H10D 62/127; H10D 64/513; H10D 64/117; H10D 64/232;
  (Continued)

(56) References Cited

U.S. PATENT DOCUMENTS 6,337,498 B1   1/2002 Hasegawa
10,056,370 B2 *  8/2018 Naito .................. H10D 62/127
(Continued)

FOREIGN PATENT DOCUMENTS

CN   107958906 A    4/2018
DE   112019000166 T5  7/2020
(Continued)

OTHER PUBLICATIONS (ISA/237) Written Opinion of the International Search Authority for International Patent Application No. PCT/JP2021/038317, issued/mailed by the Japan Patent Office on Dec. 21, 2021.
(Continued)

*Primary Examiner* — Steven B Gauthier
*Assistant Examiner* — Khatib A Rahman

(57) ABSTRACT

Provided is a semiconductor device including: an active portion provided thereon; a plurality of trench portions each including a gate conductive portion and arranged in a array direction while extending in a extending direction in the active portion, a conductive portion shape ratio of a trench length to a width of the gate conductive portion array direction being 1,000 or more; a first control pad protruding toward an inner side of the semiconductor substrate from a first outer peripheral side of the semiconductor substrate in a top view; and a first well region provided below the first control pad and to cover the first control pad in the top view, in which a shortest distance between the first well region and a trench center position as a center of a length of the plurality of trench portions in the extending direction in the top view is 1,000 μm or more.

20 Claims, 16 Drawing Sheets

(58) Field of Classification Search
CPC ...... H10D 8/422; H10D 64/519; H10D 62/53; H10D 84/811
See application file for complete search history.

(56) References Cited

U.S. PATENT DOCUMENTS

| | | | | |
|---|---|---|---|---|
| 10,629,685 | B2* | 4/2020 | Naito | H10D 62/83 |
| 11,075,291 | B1* | 7/2021 | Dainese | H10D 12/038 |
| 2010/0052044 | A1 | 3/2010 | Hirler | |
| 2016/0043073 | A1 | 2/2016 | Tamura | |
| 2016/0336404 | A1* | 11/2016 | Naito | H10D 62/393 |
| 2017/0018547 | A1* | 1/2017 | Naito | H10D 8/00 |
| 2017/0018636 | A1* | 1/2017 | Naito | H10D 62/115 |
| 2017/0236908 | A1* | 8/2017 | Naito | H10D 62/60 |
| | | | | 257/48 |
| 2018/0108737 | A1* | 4/2018 | Naito | H10D 84/811 |
| 2018/0138299 | A1* | 5/2018 | Naito | H10D 64/519 |
| 2018/0269315 | A1 | 9/2018 | Kato | |
| 2018/0294259 | A1* | 10/2018 | Sato | H10D 62/142 |
| 2018/0337233 | A1* | 11/2018 | Naito | H10D 64/231 |
| 2018/0350960 | A1* | 12/2018 | Naito | H10D 8/00 |
| 2019/0013313 | A1* | 1/2019 | Naito | H10D 8/422 |
| 2019/0157437 | A1 | 5/2019 | Matsui | |
| 2019/0198660 | A1* | 6/2019 | Kachi | H10D 62/106 |
| 2019/0252374 | A1* | 8/2019 | Kanetake | H10D 84/617 |
| 2019/0252532 | A1 | 8/2019 | Taoka | |
| 2019/0259748 | A1* | 8/2019 | Naito | H10D 62/127 |
| 2020/0035819 | A1 | 1/2020 | Naito | |
| 2020/0144149 | A1* | 5/2020 | Kubouchi | H10D 62/127 |
| 2020/0194429 | A1 | 6/2020 | Naito | |
| 2020/0243641 | A1 | 7/2020 | Nakagawa | |
| 2020/0287005 | A1 | 9/2020 | Imagawa | |
| 2020/0373418 | A1* | 11/2020 | Naito | H10D 12/00 |
| 2020/0395215 | A1* | 12/2020 | Kubouchi | H10D 62/60 |
| 2021/0091193 | A1* | 3/2021 | Iwakaji | H10D 12/481 |
| 2021/0151429 | A1* | 5/2021 | Obata | H10D 84/617 |

FOREIGN PATENT DOCUMENTS

| | | |
|---|---|---|
| DE | 112019000096 T5 | 8/2020 |
| JP | H11233765 A | 8/1999 |
| JP | 2001015738 A | 1/2001 |
| JP | 2009076733 A | 4/2009 |
| JP | 2018157200 A | 10/2018 |
| JP | 2019140348 A | 8/2019 |
| JP | 2019161199 A | 9/2019 |
| JP | 2019186309 A | 10/2019 |
| JP | 2019186510 A | 10/2019 |
| JP | 2020077674 A | 5/2020 |
| JP | 2021012995 A | 2/2021 |
| WO | 2018154963 A1 | 8/2018 |
| WO | 2019078166 A1 | 4/2019 |
| WO | 2020162013 A1 | 8/2020 |

OTHER PUBLICATIONS

Office Action issued for counterpart German Application 112021000878.1, issued by the German Patent and Trademark Office on Oct. 28, 2025 (received on Oct. 29, 2025).

Office Action issued for counterpart Chinese Application 202180024457.4, issued by The State Intellectual Property of People's Republic of China on Nov. 13, 2025.

* cited by examiner

SEMICONDUCTOR DEVICE

CROSS-REFERENCE TO RELATED APPLICATIONS

The contents of the following Japanese patent application(s) are incorporated herein by reference:
NO. 2020-174399 filed in JP on Oct. 16, 2020, and
NO. PCT/JP2021/038317 filed in WO on Oct. 15, 2021

BACKGROUND

1. Technical Field

The present invention relates to a semiconductor device.

2. Related Art

Conventionally, there is known a semiconductor device including a plurality of trench portions, and in the semiconductor device, a well region is provided below a control pad.

PRIOR ART DOCUMENTS

Patent Documents

Patent Document 1: International Publication No. 2019/078166
Patent Document 2: Japanese Patent Application Publication No. 2020-077674
Patent Document 3: Japanese Patent Application Publication No. 2019-186510
Patent Document 4: International Publication No. 2018/154963

DESCRIPTION OF EXEMPLARY EMBODIMENTS

Figure 1A:
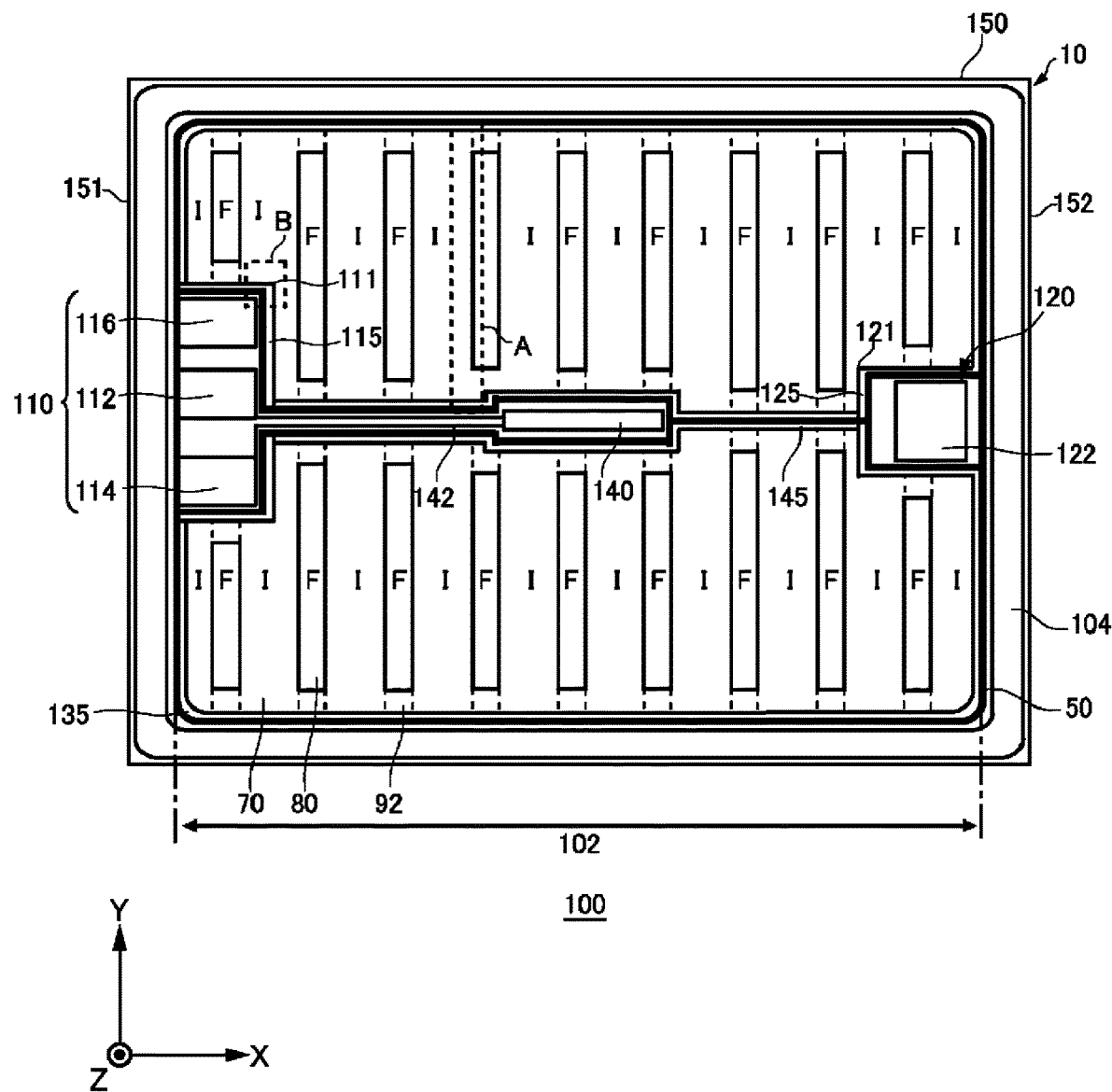
FIG. 1A shows an example of a top view of a semiconductor device 100 according to an example.

Hereinafter, the invention will be described through embodiments of the invention, but the following embodiments do not limit the invention according to claims. In addition, not all of the combinations of features described in the embodiments are essential to the solving means of the invention.

In the present specification, one side in a direction parallel to a depth direction of a semiconductor substrate is referred to as "upper", and the other side is referred to as "lower". One surface of two principal surfaces of a substrate, a layer, or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate a height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

In the present specification, a case where a term such as "same" or "equal" is mentioned may include a case where an error due to a variation in manufacturing or the like is included. The error is, for example, within 10%.

In the present specification, a conductivity type of a doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting a conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is $N_D$ and the acceptor concentration is $N_A$, the net doping concentration at any position is given as $N_D$-$N_A$. In the present specification, the net doping concentration may be simply referred to as the doping concentration.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons. In the present specification, the VOH defect may be referred to as a hydrogen donor.

In the present specification, a description of a P+ type or an N+ type means a higher doping concentration than that of the P type or the N type, and a description of a P− type or an N− type means a lower doping concentration than that of the P type or the N type. Further, in the present specification, a description of a P++ type or an N++ type means a higher doping concentration than that of the P+ type or the N+ type. The unit system in the present specification is an SI unit system unless otherwise specified. A unit of a length may be represented by cm or μm, but the calculations may be performed after converting the units into meters (m).

FIG. 1A shows an example of a top view of a semiconductor device 100 according to an example. The semiconductor device 100 is a semiconductor chip including a transistor portion 70 and a diode portion 80. The semiconductor device 100 may be mounted on a module such as IPM (Intelligent Power Module).

The transistor portion 70 is a region for performing a transistor operation in the semiconductor device 100. The transistor portion 70 includes a transistor such as IGBT (Insulated Gate Bipolar Transistor). The diode portion 80 is a region for performing a diode operation to commutate circuit currents or the like in the semiconductor device 100. The diode portion 80 includes a diode such as a free wheel diode (FWD). The semiconductor device 100 of the present example is a reverse conducting IGBT (RC-IGBT) having the transistor portion 70 and the diode portion 80 on the same chip. Note that in the respective figures, the region of the transistor portion 70 may be indicated by a symbol I, and the region of the diode portion 80 may be indicated by a symbol F.

A semiconductor substrate 10 may be a silicon substrate, a silicon carbide substrate, or a nitride semiconductor substrate such as gallium nitride or the like. The semiconductor substrate 10 according to the present example is a silicon substrate. The semiconductor substrate 10 includes an active portion 102 and an outer peripheral portion 104. In the present specification, the end portion of the outer circumference of the semiconductor substrate 10 in a top view is referred to as an outer peripheral edge 150. In a top view refers to a case where the semiconductor substrate 10 is seen from a front surface side in a direction perpendicular to the front surface (Z axis direction).

The transistor portion 70 and the diode portion 80 may be arranged alternately in a cyclical manner on the XY plane. In regions among the transistor portions 70 and the diode portions 80, a gate metal layer 50 may be provided above the semiconductor substrate 10. Note that the transistor portions 70 and the diode portions 80 of the present example include trench portions that are arranged in the X axis direction while extending in the Y axis direction. Note that the transistor portions 70 and the diode portions 80 may include trench portions that are arranged in the Y axis direction while extending in the X axis direction. Note that boundary portions 90 and boundary portions 92 to be described below may be provided in regions adjacent to the transistor portions 70 or the diode portions 80. Of the active portion 102, the boundary portions 92 may be regions between the diode portions 80 and the gate metal layer 50 in a top view. The boundary portions 92 of the present example are provided in regions between the diode portions 80 and the gate metal layer 50 in the Y axis direction and are provided between the transistor portions 70 in the X axis direction. At the boundary portions 92, a collector region 22 to be described below may be provided on a back surface of the semiconductor substrate 10.

The active portion 102 includes the transistor portions 70 and the diode portions 80. The active portion 102 is a region where a main current flows between the front surface and the back surface of the semiconductor substrate 10 in a case where the semiconductor device 100 is controlled to be in an on-state. That is, it is a region in which the current flows through the interior of the semiconductor substrate 10 from the front surface to the back surface or from the back surface to the front surface of the semiconductor substrate 10 in the depth direction. In the present specification, the transistor portions 70 and the diode portions 80 may be referred to as a device portion or a device region respectively.

Note that in a top view, a region sandwiched by the two device portions is also the active portion 102. In the present example, regions where the gate metal layer 50 is provided, that are sandwiched by the device portions, are also included in the active portion 102.

The gate metal layer 50 is formed of a material including metal. For example, the gate metal layer 50 is formed of aluminum, aluminum-silicon alloy, or aluminum-silicon-copper alloy. The gate metal layer 50 is electrically connected to a gate conductive portion of the transistor portion 70 and supplies a gate voltage to the transistor portion 70. In a top view, the gate metal layer 50 encloses an outer circumference of the active portion 102. The gate metal layer 50 is electrically connected to a gate pad 122 provided in the outer peripheral portion 104. The gate metal layer 50 may be provided along the outer peripheral edge 150 of the semiconductor substrate 10. The gate metal layer 50 may also be provided around a temperature sensing portion 140 or among the transistor portions 70 and the diode portions 80 in a top view. The gate metal layer 50 of the present example is indicated by a thick line.

The outer peripheral portion 104 is a region between the active portion 102 and the outer peripheral edge 150 of the semiconductor substrate 10 in a top view. In a top view, the outer peripheral portion 104 encloses the active portion 102. In the outer peripheral portion 104, one or more metal pads for connecting the semiconductor device 100 and an external device by wires or the like may be arranged. Note that the outer peripheral portion 104 may include an edge termination structure portion. The edge termination structure portion reduces the electric field strength on the front surface side of the semiconductor substrate 10. For example, the edge termination structure portion has a structure of a guard ring, a field plate, an RESURF, and a combination thereof.

Front surface electrodes are provided above the semiconductor substrate 10. The front surface electrodes include an emitter electrode 52 to be described below. The front surface electrodes may include a first control pad 110 and a second control pad 120. The front surface electrodes may be connected to an external electrode of the semiconductor device 100 by wire bonding or the like. Note that the number and positions of the front surface electrodes are not limited to the present example.

The first control pad 110 protrudes toward an inner side of the semiconductor substrate 10 from a predetermined first outer peripheral side 151 of the semiconductor substrate 10 in a top view. The first control pad 110 protruding toward the inner side of the semiconductor substrate 10 from the first outer peripheral side 151 means that the outer peripheral portion 104 extends toward an inner side of the active portion 102. That is, the active portion 102 is provided on a positive side or negative side of the first control pad 110 in the Y axis direction. The first control pad 110 of the present example includes an anode pad 112, a cathode pad 114, and a sense pad 116.

The second control pad 120 protrudes toward the inner side of the semiconductor substrate 10 from a second outer peripheral side 152 in a top view. The second outer peripheral side 152 is a side of the outer peripheral edge 150 opposing the first outer peripheral side 151. Note that the first outer peripheral side 151 and the second outer peripheral side 152 of the present example are parallel to the extending direction of the trench portions (Y axis direction in present example) in a top view. The second control pad 120 of the present example includes the gate pad 122.

A well region 115 is provided below the first control pad 110 and covers the first control pad 110 in a top view. The well region 115 of the present example is rectangular in a top view, and three sides of the well region 115 oppose the active portion 102. The well region 115 includes a corner portion 111 that protrudes from the first outer peripheral side 151.

A well region 125 is provided below the second control pad 120 and covers the second control pad 120 in a top view. The well region 125 of the present example is rectangular in a top view, and three sides of the well region 125 oppose the active portion 102. The well region 125 includes a corner portion 121 that protrudes from the second outer peripheral side 152.

A well region 135 covers the gate metal layer 50 in a top view. The well region 135 of the present example covers the gate metal layer 50 along the outer peripheral portion 104. The well region 135 may be connected to the well region 115.

A well region 145 covers the gate metal layer 50 in a top view. The well region 145 of the present example may further cover a temperature sensing portion 140 and a temperature sensing wiring 142. The well region 145 may be connected to the well region 115 and the well region 125.

The well regions 115, 125, 135, and 145 are regions of the second conductivity type that are provided on the front surface side of the semiconductor substrate 10. As an example, the conductivity types of the well regions 115, 125, 135, and 145 are the P+ type. By providing the well regions 115, 125, 135, and 145, it becomes easier to extract holes in the semiconductor substrate 10, thus resulting in less latch-ups. Accordingly, a withstand capability of the semiconductor device 100 can be improved.

The gate pad 122 is electrically connected to the gate metal layer 50. The gate pad 122 is electrically connected to the gate conductive portion of the transistor portion 70 via the gate metal layer 50. The gate pad 122 is set to a gate potential. The gate pad 122 of the present example has a rectangular shape in a top view. As an example, one side of the gate pad 122 may be 1,000 µm or more and 1,500 µm or less, though not limited thereto.

The anode pad 112 is electrically connected to an anode region of the temperature sensing portion 140. The anode pad 112 is electrically connected to the anode region of the temperature sensing portion 140 by the temperature sensing wiring 142. The anode pad 112 of the present example is rectangular in a top view. As an example, the anode pad 112 may include short sides that are 500 µm or more and 900 µm or less and long sides that are 1,000 µm or more and 1,500 µm or less, though not limited thereto.

The cathode pad 114 is electrically connected to a cathode region of the temperature sensing portion 140. The cathode pad 114 is electrically connected to the cathode region of the temperature sensing portion 140 by the temperature sensing wiring 142. The cathode pad 114 of the present example is rectangular in a top view. The cathode pad 114 may have the same shape as the anode pad 112 in a top view.

The temperature sensing portion 140 is arranged above the active portion 102 and detects a temperature of the semiconductor substrate 10. The temperature sensing portion 140 of the present example senses a temperature of the active portion 102. The temperature sensing portion 140 may include diodes formed of a semiconductor material such as polysilicon. The temperature sensing portion 140 is used for detecting the temperature of the semiconductor device 100 and protecting a semiconductor chip from overheating. The temperature sensing portion 140 includes long sides in the X axis direction and short sides in the Y axis direction, though not limited thereto.

The temperature sensing portion 140 of the present example is provided near a center of the active portion 102 in a top view. The temperature sensing portion 140 may be provided in either of the regions of the transistor portions 70 or the diode portions 80. That is, a collector region of the second conductivity type or a cathode region of the first conductivity type may be provided on the back surface side of the semiconductor substrate 10 on which the temperature sensing portion 140 is provided.

The temperature sensing wiring 142 electrically connects the anode pad 112 and the cathode pad 114 to the temperature sensing portion 140. Above the active portion 102, the temperature sensing wiring 142 extends from the temperature sensing portion 140 to the outer peripheral portion 104. The temperature sensing wiring 142 may be formed of the same material as the front surface electrodes. A P+ type well region may be arranged in a region of the semiconductor substrate 10 overlapping with the temperature sensing portion 140 and the temperature sensing wiring 142 in a top view.

Figure 1B:
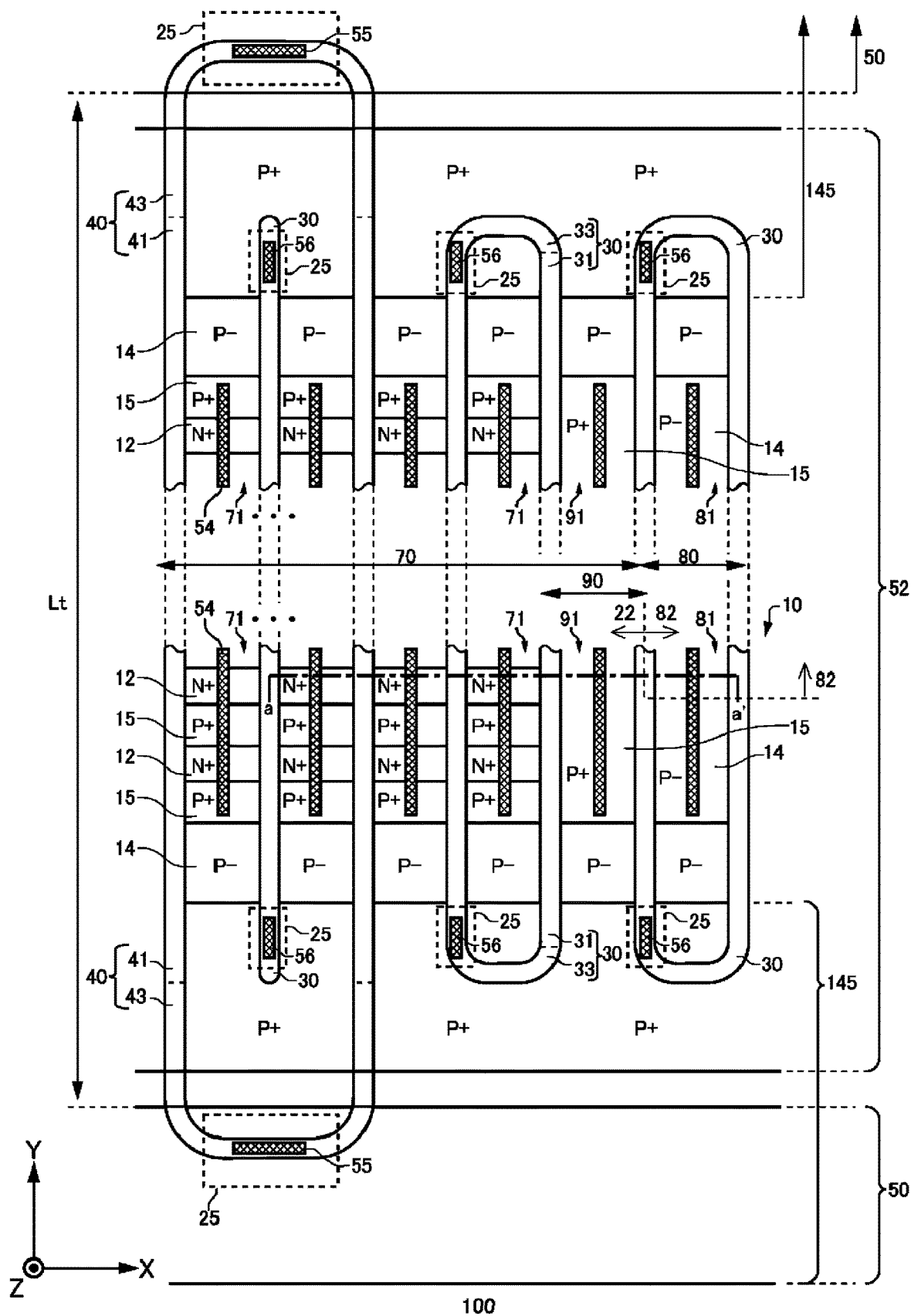
FIG. 1B shows an enlarged view of an upper surface of the semiconductor device 100.

FIG. 1B shows an enlarged view of the upper surface of the semiconductor device 100. In the present example, an enlarged view of a region A shown in FIG. 1A is shown.

The transistor portion 70 may be a region obtained by projecting the collector region 22 provided on the back surface side of the semiconductor substrate 10 onto the front surface of the semiconductor substrate 10. The collector region 22 has a second conductivity type. The collector region 22 of the present example is of P+ type, by way of example. The transistor portion 70 includes a boundary portion 90 that is positioned at a boundary between transistor portion 70 and the diode portion 80.

The diode portion 80 may be a region obtained by projecting the cathode region 82 provided on the back surface side of the semiconductor substrate 10 onto the front surface of the semiconductor substrate 10. The cathode region 82 has a first conductivity type. The cathode region 82 of the present example is of N+ type, by way of example.

The semiconductor device 100 of the present example includes, in the front surface of the semiconductor substrate 10, a gate trench portion 40, a dummy trench portion 30, an emitter region 12, a base region 14, a contact region 15, and the a well region 145. The semiconductor device 100 of the present example also includes the emitter electrode 52 and the gate metal layer 50, which are provided above the front surface of the semiconductor substrate 10.

The emitter electrode 52 is provided above the gate trench portion 40, the dummy trench portion 30, the emitter region 12, the base region 14, the contact region 15, and the well region 145. In addition, the gate metal layer 50 is provided above the gate trench portion 40 and the well region 145.

The emitter electrode 52 and the gate metal layer 50 are formed of a material including metal. For example, at least a partial region of the emitter electrode 52 may be formed of aluminum, aluminum-silicon alloy, or aluminum-silicon-copper alloy. The emitter electrode 52 may include barrier metal formed of titanium, titanium compound, and the like under the region formed of aluminum and the like. The emitter electrode 52 and the gate metal layer 50 are provided separately from each other.

The emitter electrode 52 and the gate metal layer 50 are provided above the semiconductor substrate 10 with an interlayer dielectric film 38 interposed therebetween. The interlayer dielectric film 38 is omitted in FIG. 1A. Contact holes 54, 55, and 56 are provided passing through the interlayer dielectric film 38.

The contact holes 55 connect the gate metal layer 50 and the gate conductive portions inside the transistor portions 70. Inside the contact hole 55, a plug formed of tungsten or the like may be formed. The contact holes 56 connect the emitter electrode 52 and dummy conductive portions inside the dummy trench portions 30. Inside the contact hole 56, a plug formed of tungsten or the like may be formed.

Connection portions 25 electrically connect the front surface electrodes such as the emitter electrode 52 and the gate metal layer 50 and the conductive portions formed inside the trench portions. In one example, the connection portion 25 is provided between the gate metal layer 50 and the gate conductive portion. The connection portion 25 is also provided between the emitter electrode 52 and the dummy conductive portion. The connection portion 25 includes a conductive material such as polysilicon doped with an impurity. The connection portion 25 of the present example is polysilicon doped with an N type impurity (N+). The connection portion 25 is provided above the front surface of the semiconductor substrate 10 via a dielectric film such as an oxide film, or the like.

The gate trench portion 40 is arranged at a predetermined interval along a predetermined array direction (in the present example, the X axis direction). The gate trench portion 40 in the present example may have two extending portions 41 extending along the extending direction (in the present example, the Y axis direction) that is parallel to the front surface of the semiconductor substrate 10 and perpendicular to the array direction and a connecting portion 43 connecting the two extending portions 41. The gate trench portion 40 is set at a gate potential.

Preferably, at least a part of the connecting portion 43 is formed in a curved shape. By connecting end portions of the two extending portions 41 of the gate trench portions 40, an electric field strength at the end portions of the extending portions 41 can be reduced. At the connecting portion 43 of the gate trench portion 40, the gate metal layer 50 may be connected to the gate conductive portion.

The dummy trench portion 30 is a trench portion electrically connected with the emitter electrode 52. Similar to the gate trench portion 40, the dummy trench portion 30 is arranged at a predetermined interval along a predetermined array direction (in the present example, the X axis direction). Similar to the gate trench portion 40, the dummy trench portion 30 of the present example may be in a U shape on the front surface of the semiconductor substrate 10. That is, the dummy trench portion 30 may include two extending portions 31 which extend along the extending direction and a connecting portion 33 which connects the two extending portions 31.

The transistor portion 70 of the present example has a structure in which the two gate trench portions 40 and three dummy trench portions 30 are arranged repeatedly. That is, the transistor portion 70 of the present example includes the gate trench portions 40 and the dummy trench portions 30 at a ratio of 2:3. For example, the transistor portion 70 includes one extending portion 31 between two extending portions 41. In addition, the transistor portion 70 includes two extending portions 31 adjacent to the gate trench portion 40.

Note that the ratio of the gate trench portions 40 and the dummy trench portions 30 is not limited to the present example. The ratio of the gate trench portions 40 and the dummy trench portions 30 may be 1:1 or may be 2:4. Further, a so-called full gate trench structure (all gate trench structure) in which the dummy trench portions 30 are not provided in the transistor portion 70 and all the trench portions are the gate trench portions 40 may also be adopted.

The well region 145 is a region of a second conductivity type provided closer to the front surface side of the semiconductor substrate 10 than the drift region 18, which will be described below. The well region 145 is one example of the well region provided on the edge side of the semiconductor device 100. The well region 145 is of P+ type, by way of example. The well region 145 is formed within a predetermined range from the end portion of the active region on the side where the gate metal layer 50 is provided. A diffusion depth of the well region 145 may be deeper than depths of the gate trench portion 40 and the dummy trench portion 30. Partial regions of the gate trench portion 40 and the dummy trench portion 30 on the gate metal layer 50 side are formed in the well region 145. The bottoms of ends of the gate trench portion 40 and the dummy trench portion 30 in the extending direction may be covered by the well region 145. The well region 145 may be formed simultaneous with the well region 115 and the well region 125. The diffusion depths of the well regions 115, 125, 135, and 145 may be the same or may substantially be the same. The well regions 145 may be provided so as to cover the gate metal layer 50 in a top view. The well regions 145 may be electrically connected to the emitter electrode 52 at positions closer to the outer peripheral portion 104 on an outer peripheral side than the transistor portion 70 or the diode portion 80.

The contact holes 54 are portions where openings are formed in the interlayer dielectric film 38 to expose the front surface 21 of the semiconductor substrate 10. The contact holes 54 are formed above the respective regions of the emitter regions 12 and the contact regions 15 in the transistor portion 70. The emitter regions 12 or the contact regions 15 come into contact with and are electrically connected to the emitter electrode 52 via the contact holes 54.

In the diode portion 80, the contact holes 54 are formed above the base regions 14. The base regions 14 in the diode portion 80 may come into contact with the emitter electrode 52 via the contact holes 54. On the front surface 21 on which the contact holes 54 are formed, a high-concentration layer having the same conductivity type as the base regions 14 may be formed between the base regions 14 and the emitter electrode 52 for reducing a contact resistance.

At the boundary portion 90, the contact holes 54 are provided above the contact regions 15. The contact hole 54 does not need to be provided above the well regions 145 provided at both ends in the Y axis direction. In this manner, one or more contact holes 54 are formed in the interlayer dielectric film 38. The one or more contact holes 54 may be provided to extend in the extending direction.

The boundary portion 90 is a region provided in the transistor portion 70 and adjacent to the diode portion 80. The boundary portion 90 may include the contact region 15. The boundary portion 90 of the present example does not include the emitter region 12. In an example, the trench portions in the boundary portion 90 are the dummy trench portions 30. The boundary portion 90 of the present example includes the trench portions of which the dummy trench portions 30 are arranged at the both ends in the X axis direction.

The mesa portion 71, the mesa portion 91, and the mesa portion 81 are mesa portions provided adjacent to the trench portions, in a plane parallel to the front surface of the semiconductor substrate 10. The mesa portion may be a portion of the semiconductor substrate 10 sandwiched between two adjacent trench portions, which is located from the front surface of the semiconductor substrate 10 to the depth of the deepest bottom portion of each trench portion. The extending portions of each trench portion may be regarded as one trench portion. That is, the region sandwiched between two extending portions may be set to be a mesa portion.

The mesa portion 71 is provided adjacent to at least one of the dummy trench portion 30 or the gate trench portion 40 in the transistor portion 70. The mesa portion 71 may include the emitter regions 12, the base region 14, the contact regions 15, and the well region 145 on the front surface of the semiconductor substrate 10. In the mesa portion 71, the emitter regions 12 and the contact regions 15 may be provided alternately in the extending direction.

The mesa portion 91 is provided in the boundary portion 90. The mesa portion 91 may include the contact region 15 or the well region 145 on the front surface of the semiconductor substrate 10.

The mesa portion 81 is provided in a region interposed between the dummy trench portions 30 adjacent to each other in the diode portion 80. The mesa portion 81 may include the base region 14 and the contact region 15 or the well region 145 on the front surface of the semiconductor substrate 10.

The base region 14 is a region of the second conductivity type provided in the transistor portion 70 and the diode portion 80 on the front surface side of the semiconductor substrate 10. The base region 14 is of the P– type, by way of example. The base region 14 may be provided at both end portions of the mesa portion 71 and the mesa portion 91 in the Y axis direction, at the front surface of the semiconductor substrate 10. Note that FIG. 1A illustrates only one end portion of the base region 14 in the Y axis direction. The base region 14 may have a lower doping concentration than the well region 145.

The emitter region 12 is a region of the first conductivity type which has a higher doping concentration than the drift region 18. The emitter region 12 of the present example is of N+ type, by way of example. An example of a dopant of the emitter region 12 is arsenic (As). The emitter region 12 is provided in contact with the gate trench portion 40 in the front surface of the mesa portion 71. The emitter region 12 may be provided to extend in the X axis direction from one of two trench portions sandwiching the mesa portion 71 to the other of the two trench portions. The emitter region 12 is also provided below the contact hole 54.

In addition, the emitter region 12 may or may not be in contact with the dummy trench portion 30. The emitter region 12 of the present example is in contact with the dummy trench portion 30. The emitter region 12 does not need to be provided in the mesa portion 91 of the boundary portion 90.

The contact region 15 is a region of the second conductivity type having a higher doping concentration than the base region 14. The contact region 15 of the present example is of P+ type, by way of example. A thickness of the contact region 15 in the depth direction may be smaller than a thickness of the base region 14 in the depth direction. The contact region 15 of the present example is provided at the front surfaces of the mesa portions 71 and 91. The contact region 15 may be provided from one trench portion to the other trench portion of two trench portions which interpose the mesa portion 71 or the mesa portion 91 therebetween in the X axis direction. The contact region 15 may be or may not be in contact with the gate trench portion 40. Moreover, the contact region 15 may be or may not be in contact with the dummy trench portion 30. In the present example, the contact region 15 is in contact with the dummy trench portion 30 and the gate trench portion 40. The contact region 15 is also provided below the contact hole 54. Note that the contact region 15 may also be provided in the mesa portion 81.

A trench length Lt is a length of the plurality of trench portions in the extending direction. The trench length Lt of the present example corresponds to a distance between the gate metal layer 50 provided on a positive side of the trench portions in the Y axis direction and the gate metal layer 50 provided on a negative side of the trench portions in the Y axis direction. The trench length Lt may be 2,000 μm or more, 3,000 μm or more, 4,000 μm or more, 4,600 μm or more, or 6,000 μm or more. In addition, the trench length Lt may be 50,000 μm or less, 30,000 μm or less, or 20,000 μm or less.

Figure 1C:
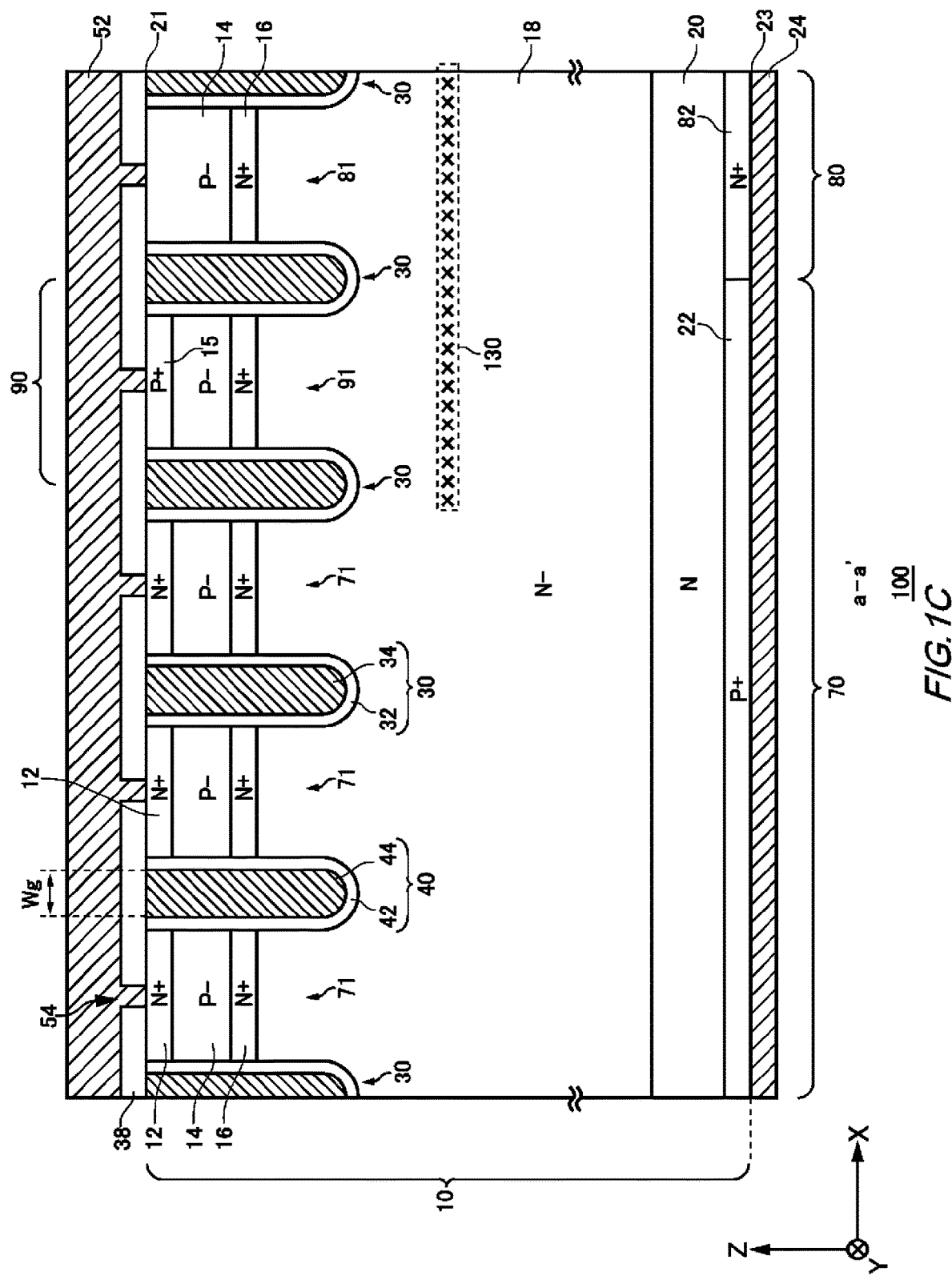
FIG. 1C illustrates one example of a cross section a-a' in FIG. 1B.

FIG. 1C illustrates an example of a cross section a-a' of FIG. 1B. The cross section a-a' is an XZ plane passing through the emitter region 12 in the transistor portion 70. In the cross section a-a', the semiconductor device 100 of the present example has the semiconductor substrate 10, the interlayer dielectric film 38, the emitter electrode 52, and the collector electrode 24. The emitter electrode 52 is formed above the semiconductor substrate 10 and the interlayer dielectric film 38.

The drift region 18 is a region of the first conductivity type provided in the semiconductor substrate 10. The drift region 18 of the present example is of N– type, by way of example. The drift region 18 may be a remaining region where another doping region is not formed in the semiconductor substrate 10. That is, the doping concentration of the drift region 18 may be a doping concentration of the semiconductor substrate 10.

A buffer region 20 is a region of the first conductivity type provided below the drift region 18. The buffer region 20 of the present example is of N type, by way of example. A doping concentration of the buffer region 20 is higher than the doping concentration of the drift region 18. The buffer region 20 may function as a field stop layer to prevent a depletion layer, expanded from the back surface side of the base region 14, from reaching the collector region 22 of the second conductivity type and the cathode region 82 of the first conductivity type.

The collector region 22 is provided below the buffer region 20 in the transistor portion 70. The cathode region 82 is provided below the buffer region 20 in the diode portion 80. A boundary between the collector region 22 and the cathode region 82 may be a boundary between the transistor portion 70 and the diode portion 80.

The collector electrode 24 is formed on the back surface 23 of the semiconductor substrate 10. The collector electrode 24 is formed of a conductive material such as metal.

The base region 14 is a region of the second conductivity type provided above the drift region 18, in the mesa portion 71, the mesa portion 91, and the mesa portion 81. The base region 14 may be provided in contact with the gate trench portion 40. The base region 14 may be provided in contact with the dummy trench portion 30.

The emitter region 12 is provided between the base region 14 and the front surface 21 in the mesa portion 71. The emitter region 12 may be provided in contact with the gate trench portion 40. The emitter region 12 may be or may not be in contact with the dummy trench portion 30. Note that the emitter region 12 does not need to be provided in the mesa portion 91.

The contact region 15 is provide above the base region 14 in the mesa portion 91. The contact region 15 is provided in contact with the dummy trench portions 30 in the mesa portion 91. In another cross section, the contact region 15 may be provided on the front surface 21 in the mesa portion 71.

An accumulation region 16 is a region of the first conductivity type provided closer to the front surface 21 of the semiconductor substrate 10 than the drift region 18. The accumulation region 16 of the present example is of N+ type, by way of example. A donor concentration of the accumulation region 16 is larger than the donor concentration of the drift region 18. The accumulation region 16 is provided in the transistor portion 70 and the diode portion 80. The accumulation region 16 of the present example is also provided in the boundary portion 90. This allows the semiconductor device 100 to avoid mask misalignment in the accumulation region 16.

In addition, the accumulation region 16 is provided in contact with the gate trench portion 40. The accumulation region 16 may be or may not be in contact with the dummy trench portion 30. The doping concentration of the accumulation region 16 is higher than the doping concentration of the drift region 18. Providing the accumulation region 16 can enhance a carrier injection enhancement effect (IE effect) to reduce an ON voltage of the transistor portion 70.

One or more gate trench portions 40 and one or more dummy trench portions 30 are provided on the front surface 21. Each trench portion is provided from the front surface 21 to the drift region 18. In the region where at least any of the emitter region 12, the base region 14, the contact region 15, or the accumulation region 16 is provided, each trench portion also penetrates these regions to reach the drift region 18. The configuration of the trench portion penetrating the doping region is not limited to the one manufactured in the order of forming the doping region and then forming the trench portion. The configuration of the trench portion penetrating the doping region also includes a configuration of the doping region being formed between the trench portions after forming the trench portion.

The gate trench portion 40 has a gate trench, a gate dielectric film 42, and a gate conductive portion 44 that are formed in the front surface 21. The gate dielectric film 42 is formed to cover an inner wall of the gate trench. The gate dielectric film 42 may be formed by oxidizing or nitriding a semiconductor on the inner wall of the gate trench. The gate conductive portion 44 is formed on the inner side than the gate dielectric film 42 inside the gate trench. The gate dielectric film 42 insulates the gate conductive portion 44 from the semiconductor substrate 10. The gate conductive portion 44 is formed of a conductive material such as polysilicon. The gate trench portion 40 is covered by the interlayer dielectric film 38 on the front surface 21.

The gate conductive portion 44 includes a region opposing the adjacent base region 14 in the mesa portion 71 side by sandwiching the gate dielectric film 42, in the depth direction of the semiconductor substrate 10. When a predetermined voltage is applied to the gate conductive portion 44, a channel is formed on a surface layer being at a boundary within the base region 14 and in direct contact with the gate trench, due to an electron inversion layer.

A width of the gate trench portion 40 may be larger than 0.5 μm and smaller than 2.0 μm. A width of the gate trench portion 40 of the present example is 1.0 μm. A thickness of the gate dielectric film 42 may be larger than 0.05 μm and smaller than 0.2 μm. The thickness of the gate dielectric film 42 of the present example is 0.1 μm.

A width Wg of the gate conductive portion 44 only needs to be obtained by subtracting the thickness of the gate dielectric film 42 (i.e., thickness corresponding to two layers of gate dielectric film 42) from the width of the gate trench portion 40. The width of the gate trench portion 40 may be constant in the depth direction or may increase or decrease in the depth direction. The width Wg of the gate conductive portion 44 may be a width of the gate conductive portion 44 at a depth position that is the same as a depth of the base region 14 where a peak doping concentration is obtained. Alternatively, the width Wg of the gate conductive portion 44 may be a width of the gate conductive portion 44 at a depth at which the base region 14 comes into contact with the emitter region 12, that is, a pn junction depth.

The dummy trench portion 30 may have the same structure as the gate trench portion 40. The dummy trench portion 30 includes a dummy trench, a dummy dielectric film 32, and a dummy conductive portion 34 that are formed on the front surface 21 side. The dummy dielectric film 32 is formed to cover an inner wall of the dummy trench. The dummy conductive portion 34 is formed on the inner side than the dummy dielectric film 32 and formed inside the dummy trench. The dummy dielectric film 32 insulates the dummy conductive portion 34 from the semiconductor substrate 10. The dummy trench portion 30 is covered by the interlayer dielectric film 38 on the front surface 21.

The interlayer dielectric film 38 is provided on the front surface 21. The emitter electrode 52 is provided above the interlayer dielectric film 38. In the interlayer dielectric film 38, one or more contact holes 54 are provided for electrically connecting the emitter electrode 52 with the semiconductor substrate 10. Similarly, the contact hole 55 and the contact hole 56 may be provided to extend through the interlayer dielectric film 38.

A lifetime control region 130 may be provided on the front surface 21 side of the semiconductor substrate 10 in the diode portion 80. The front surface 21 side of the semiconductor substrate 10 may refer to a region more on the front surface 21 side than a center of the semiconductor substrate 10 in the depth direction. Further, when the lifetime control regions are provided at different depth positions in the semiconductor substrate 10, a lifetime control region closest to the front surface 21 may be set as the lifetime control region 130.

The lifetime control region 130 may be a region where a lifetime killer is intentionally introduced by injecting an impurity into the semiconductor substrate 10, or the like. A value of the lifetime in carriers of electrons or holes in the region intentionally introduced with the lifetime killer is smaller than that of the carriers in the region not intentionally introduced with the lifetime killer. The lifetime killer is a recombination center of carriers and may be a lattice defect, a vacancy, a divacancy, a dangling bond formed by a vacancy or the like, or a complex defect of those with elements configuring the semiconductor substrate 10 or dislocation. Further, the lifetime killer may be a noble gas element such as helium and neon, a hydrogen element, or the like, or may be transition metal such as platinum and gold.

By providing the lifetime control region 130 in the diode portion 80, it becomes possible to adjust a carrier lifetime in the diode portion 80 and reduce losses during reverse recovery. Note that the lifetime control region 130 may be formed by an electron beam irradiation. Since a penetration force is strong in the case of the electron beam irradiation, a distribution of the lifetime killer becomes substantially uniform from the front surface 21 to the back surface 23 in both a case of an irradiation from the front surface 21 of the semiconductor substrate 10 and a case of an irradiation from the back surface 23. However, when any position on the front surface 21 side is assumed to be the lifetime control region 130, a discussion similar to that of other lifetime killers is established.

The lifetime control region 130 of the present example is also provided in the boundary portion 90. Accordingly, it becomes possible to suppress, during reverse recovery of the diode portion 80, a flow of holes from the base regions 14 of the transistor portion 70 to the cathode region 82 of the diode portion 80 and thus reduce reverse recovery losses. Note that the lifetime control region 130 may be terminated in the middle of the boundary portion 90 and does not need to be provided in the entire boundary portion 90.

Figure 1D:
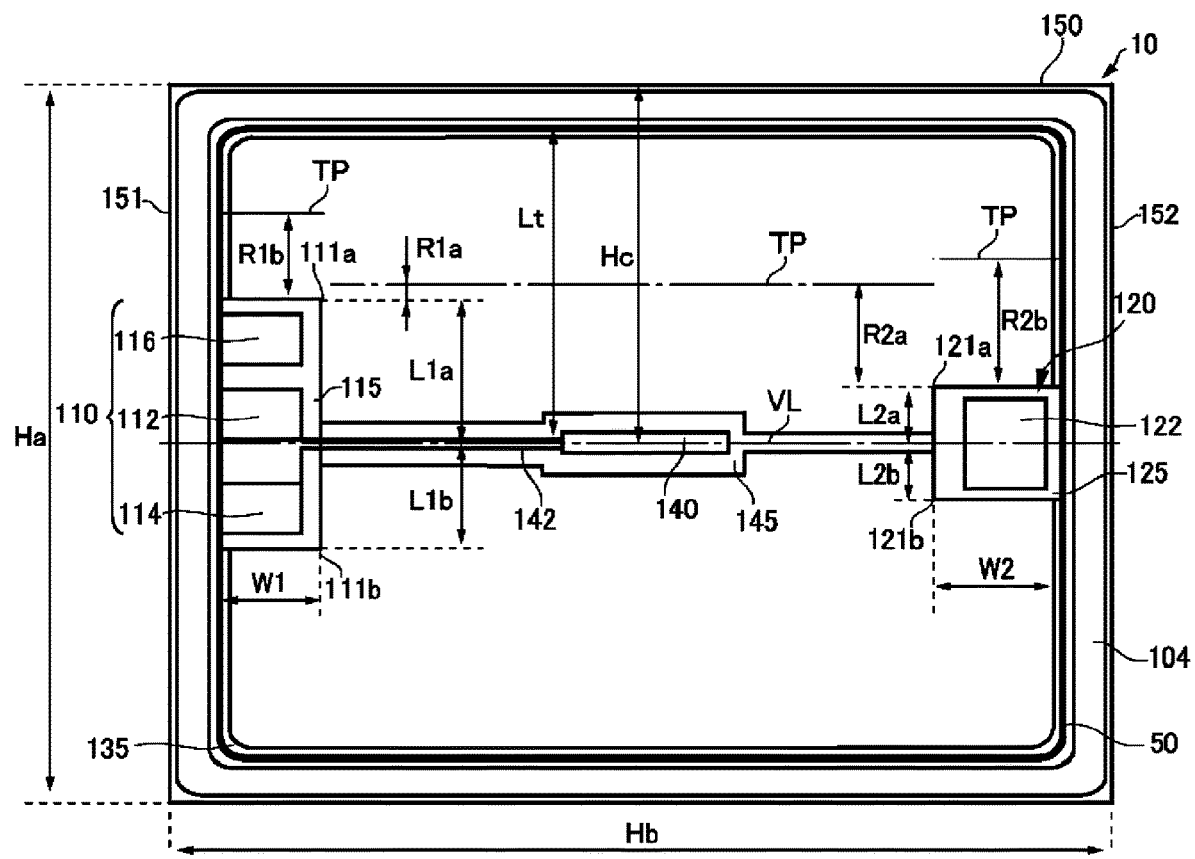
FIG. 1D is a diagram for explaining a layout of the upper surface of the semiconductor device 100.
Figure 1D:
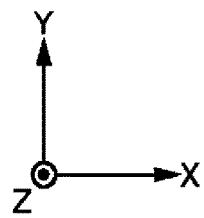

FIG. 1D is a diagram for explaining a layout of the upper surface of the semiconductor device 100. In FIG. 1D, for explaining the structure of the semiconductor device 100, a partial configuration is omitted.

A center virtual line VL is orthogonal to the first outer peripheral side 151 and passes a center of the first outer peripheral side 151. The center virtual line VL of the present example is a virtual line that passes the center of the semiconductor substrate 10 in the Y axis direction and extends in the X axis direction. A distance Ha is a length of the semiconductor substrate 10 in a direction orthogonal to the center virtual line VL and corresponds to the lengths of the first outer peripheral side 151 and the second outer peripheral side 152. A distance Hb is a length of the semiconductor substrate 10 in a direction parallel to the center virtual line VL. The distance Hb of the present example is longer than the distance Ha, but the distance Hb may be the same as or smaller than the distance Ha. A distance Hc is a distance from the center virtual line VL to the outer peripheral edge 150 of the semiconductor substrate 10 in the direction orthogonal to the center virtual line VL. That is, the distance Hc is half the length of the distance Ha.

The well region 115 includes two corner portions, that is, corner portions 111a and 111b. The corner portions 111a and 111b are provided in regions opposite to each other across the center virtual line VL. A corner portion farther from the center virtual line VL is the corner portion 111a, and a corner portion closer to the center virtual line VL is the corner portion 111b.

A distance L1a is a distance from the center virtual line VL to the corner portion 111a in the extending direction. The distance L1a of the present example is a distance from the center virtual line VL to the farther corner portion 111a in the well region 115 provided asymmetrically. A distance L1b is a distance from the center virtual line VL to the corner portion 111b in the extending direction. The distance L1a may be the same as or different from the distance L1b. The distance L1a of the present example is larger than the distance L1b. That is, the well region 115 of the present example is provided asymmetrically with respect to the center virtual line VL. The distance L1a may be 30% or more or 40% or more of the distance Hc. The distance L1a may be 90% or less or 80% or less of the distance Hc.

The well region 125 includes two corner portions, that is, corner portions 121a and 121b. A corner portion on a side on which the corner portion 111a is provided in the extending direction is the corner portion 121a, and a corner portion on a side on which the corner portion 111b is provided is the corner portion 121b. That is, the corner portion 121b is provided on an opposite side of the corner portion 121a with respect to the center virtual line VL. Note that although the corner portions 111a, 111b, 121a, and 121b are illustrated at right angles in FIG. 1D, tip ends of the corner portions may be curved. Alternatively, the tip ends of the corner portions may be cut off to become polygonal. Accordingly, an increase of an electric field intensity at the corner portions can be suppressed. The same holds true for other corner portions of the well region 125. The same holds true for the corner portion 111 of the present example and subsequent examples.

A distance L2a is a distance from the center virtual line VL to the corner portion 121a in the extending direction. A distance L2b is a distance from the center virtual line VL to the corner portion 121b in the extending direction. The distance L2a of the present example is equal to the distance L2b. That is, the well region 125 is provided symmetrically with respect to the center virtual line VL. The distance L1a may be longer than or shorter than the distance L2a.

A shortest distance R1a is a shortest distance between the well region 115 and a trench center position TP in a top view. The trench center position TP is a center position of the trench length Lt of the plurality of trench portions. The shortest distance R1a may be a shortest distance between the corner portion 111a and the trench center position TP. An increase of the distance L1a leads to a reduction of the shortest distance R1a, and thus the corner portion 111a approaches the trench center position TP. The shortest distance R1a may be 1,000 µm or more, 1,500 µm or more, or 2,000 µm or more.

By increasing the trench length Lt, a current filament is likely to be generated near the trench center position TP due to a gate delay. On the other hand, an operation area can be increased as the trench length Lt becomes longer, and thus a large current can be controlled. Therefore, by setting the shortest distance R1a within an appropriate range, a destructive failure of a device can be avoided even with a large trench length Lt.

Also taking the width Wg of the gate conductive portion into consideration, a ratio obtained by dividing the trench length Lt by the width Wg is given as a conductive portion shape ratio α. The operation area can be increased as the conductive portion shape ratio α becomes larger, and thus a large current can be controlled. The conductive portion shape ratio α may be 1,000 or more, 3,000 or more, 5,000 or more, or 6,000 or more. The conductive portion shape ratio α may be $1 \times 10^6$ or less, $3 \times 10^5$ or less, $1 \times 10^5$ or less, or 50,000 or less. With the conductive portion shape ratio α set within these ranges, the trench length Lt may be within or outside the range described above. A mesa width in the array direction may be smaller than a width of the gate trench portion 40 in the array direction. Note that the conductive portion shape ratio α may be determined by comprehensively considering a delay time caused by gate charge/discharge in addition to current characteristics. In the semiconductor device 100 of the present example, since a destructive failure of a device can be avoided even with a long trench length Lt by appropriately setting the shortest distance R1a, the conductive portion shape ratio α of a wider range can be adopted. Note that a value of the conductive portion shape ratio α may be used in combination with any of the values of the shortest distances R1a, R1b, R2a, and R2b that are disclosed in the present example.

The shortest distance R1b is a shortest distance between the well region 115 and the trench center position TP of the active portion 102 adjacent to the well region 115 in the extending direction. The shortest distance R1b of the present example is longer than the shortest distance R1a. The shortest distance R1b may be 1,000 μm or more, 1,500 μm or more, or 2,000 μm or more.

The shortest distance R2a is a shortest distance between the well region 125 and the trench center position TP of the active portion 102 adjacent to the well region 125 in the extending direction in a top view. The shortest distance R2a may be a shortest distance between the corner portion 121a and the trench center position TP. The shortest distance R2a may be 1,000 μm or more, 1,500 μm or more, or 2,000 μm or more.

The shortest distance R2b is a shortest distance between the well region 125 and the trench center position TP of the active portion 102 adjacent to the well region 125 in the extending direction. The shortest distance R2b of the present example is longer than the shortest distance R2a. The shortest distance R2b may be 1,000 μm or more, 1,500 μm or more, or 2,000 μm or more.

When current crowding is generated in the vicinity of the P type well region, currents may flow into the well region to cause a destructive failure of a device. When gate signals become unbalanced during a turn-off operation, currents are crowded at center portions of the trenches to thus cause a current filament. When a current filament flows into the P type well region having a strong electric field, an electric field may be applied to the oxide film to cause an insulation breakdown, and a short circuit may be caused between the collector and the emitter to cause a destructive failure of a device.

In the semiconductor device 100 of the present example, by setting the shortest distances R1a and R2a to be 1,500 μm or more, an inflow of a current filament to the P type well region can be suppressed. Accordingly, since a destructive failure of a device in the vicinity of the P type well region can be avoided, a turn-off withstand capability can be improved.

Figure 2A:
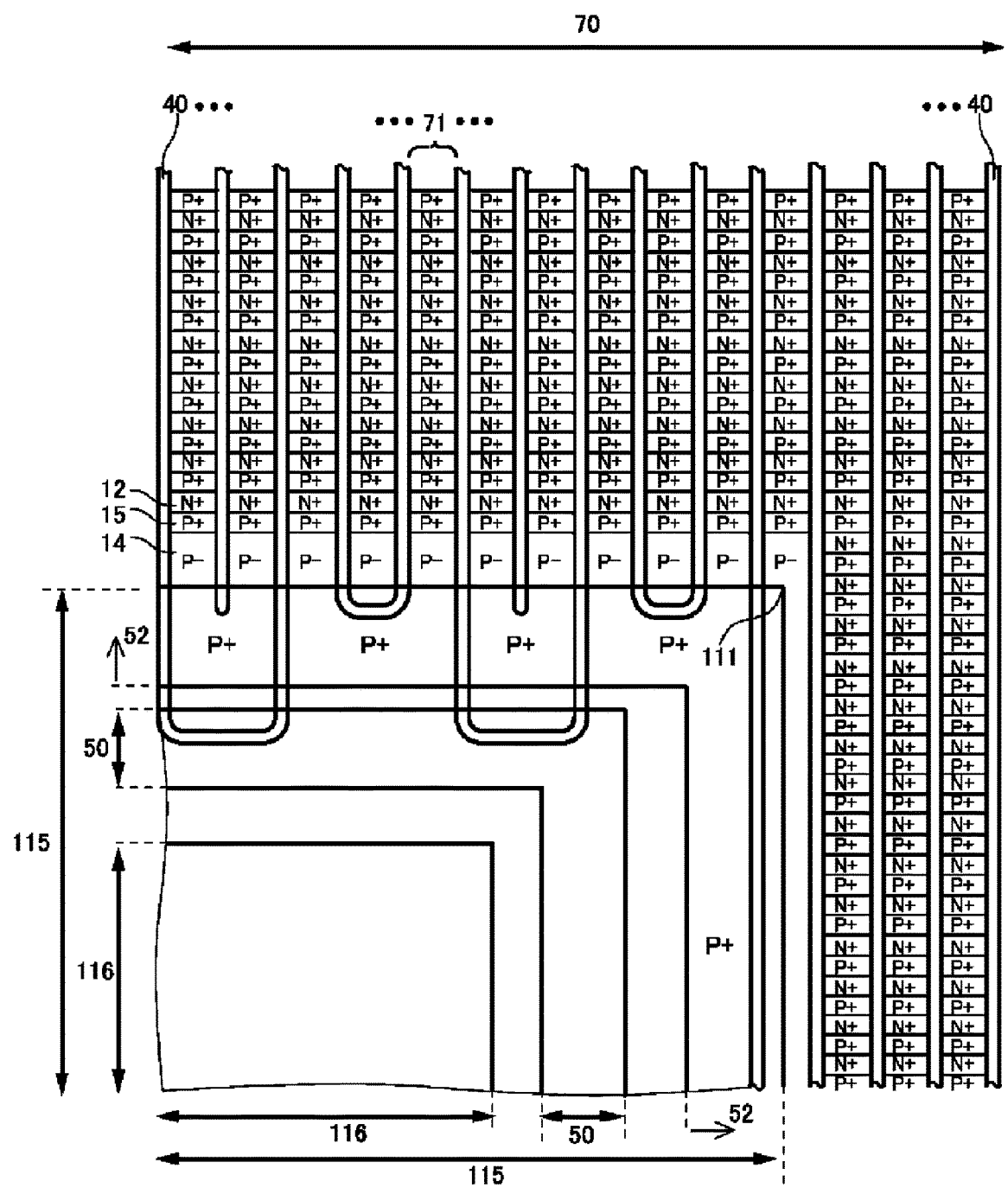
FIG. 2A shows an enlarged view of the upper surface of the semiconductor device 100.

FIG. 2A shows an enlarged view of the upper surface of the semiconductor device 100. In the present example, an enlarged view of a region B shown in FIG. 1A is shown. The corner portion 111 of the present example is positioned at the transistor portion 70 in a top view. Positioned at the transistor portion 70 may mean that the corner portion 111 is provided in the mesa portion 71 sandwiched by the gate trench portions 40. The gate trench portions 40 may be provided above the well region 115. The corner portion 111 of the present example is adjacent to the base regions 14 of the transistor portion 70. The gate trench portions 40 extend to the gate metal layer 50. The gate metal layer 50 is provided along the outer circumference of the well region 115, though not limited thereto.

Figure 2B:
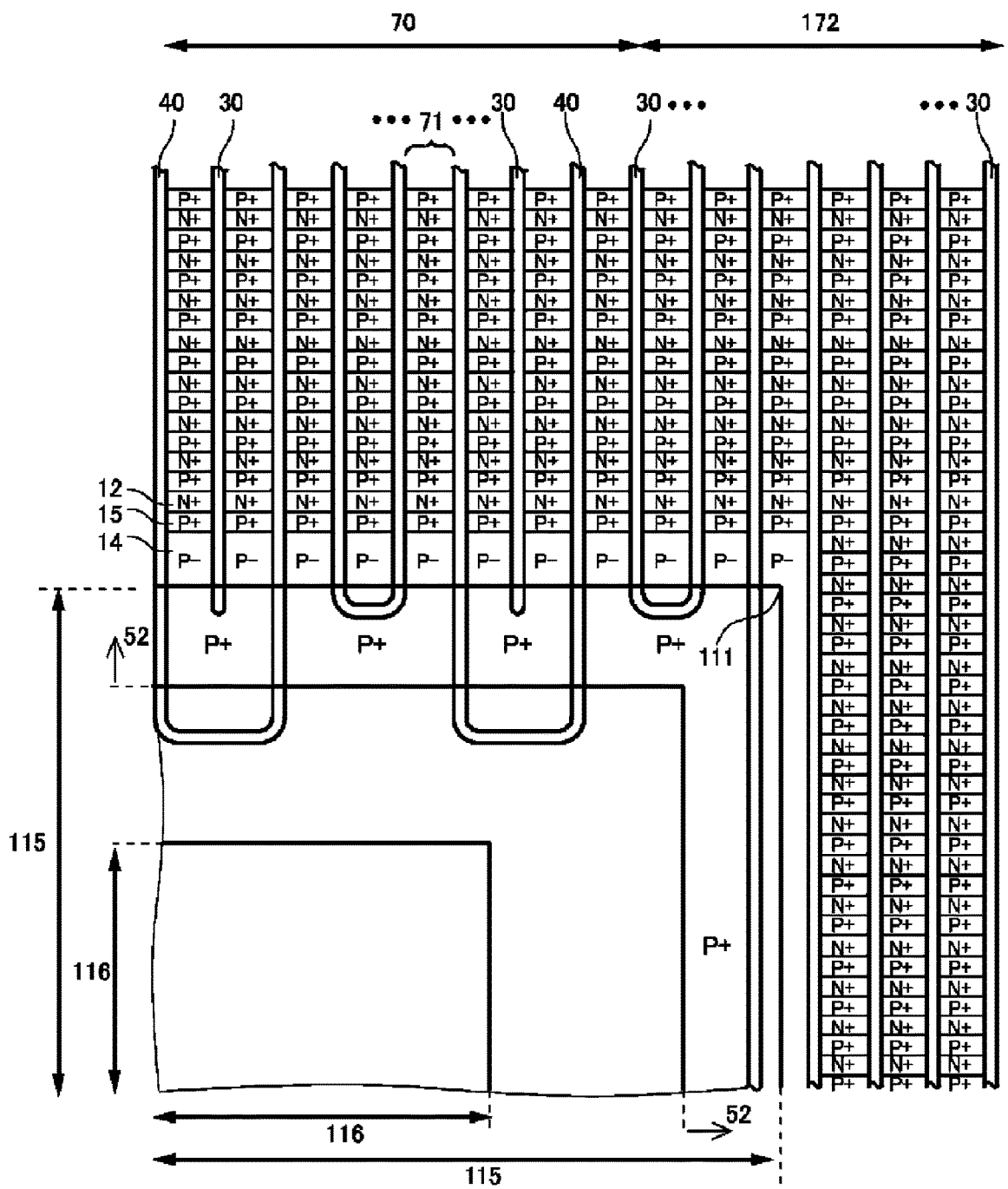
FIG. 2B shows an enlarged view of the upper surface of the semiconductor device 100.

FIG. 2B shows an enlarged view of the upper surface of the semiconductor device 100. The semiconductor device 100 of the present example is an example of a case where the corner portion 111 is provided in a dummy trench region 172.

The dummy trench region 172 is a region where the plurality of trench portions are set at an emitter potential. The dummy trench region 172 of the present example includes the dummy trench portions 30 set at the emitter potential. The dummy trench region 172 of the present example includes the mesa portions 71 in which the emitter regions 12 and the contact regions 15 are arranged alternately. The emitter regions 12 may be provided in the dummy trench region 172 or do not need to be provided in the dummy trench region 172. Since currents are not turned on/off by the gate trench portions 40, a main current does not flow in the dummy trench region 172. Thus, the dummy trench region 172 has less main current crowding on the front surface 21.

The corner portion 111 is positioned at the dummy trench region 172 in a top view. The corner portion 111 being positioned at the dummy trench region 172 may mean that a trench portion closest to the corner portion 111 is the dummy trench portion 30. Further, the corner portion 111 being positioned at the dummy trench region 172 may also mean that at least one dummy trench portion 30 is provided between the corner portion 111 and the gate trench portion 40. The corner portion 111 of the present example is provided adjacent to the base region 14 between the two adjacent dummy trench portions 30.

By covering the vicinity of the corner portion 111 by the dummy trench region 172 in the semiconductor device 100 of the present example, current crowding in the vicinity of the corner portion 111 can be suppressed.

Figure 2C:
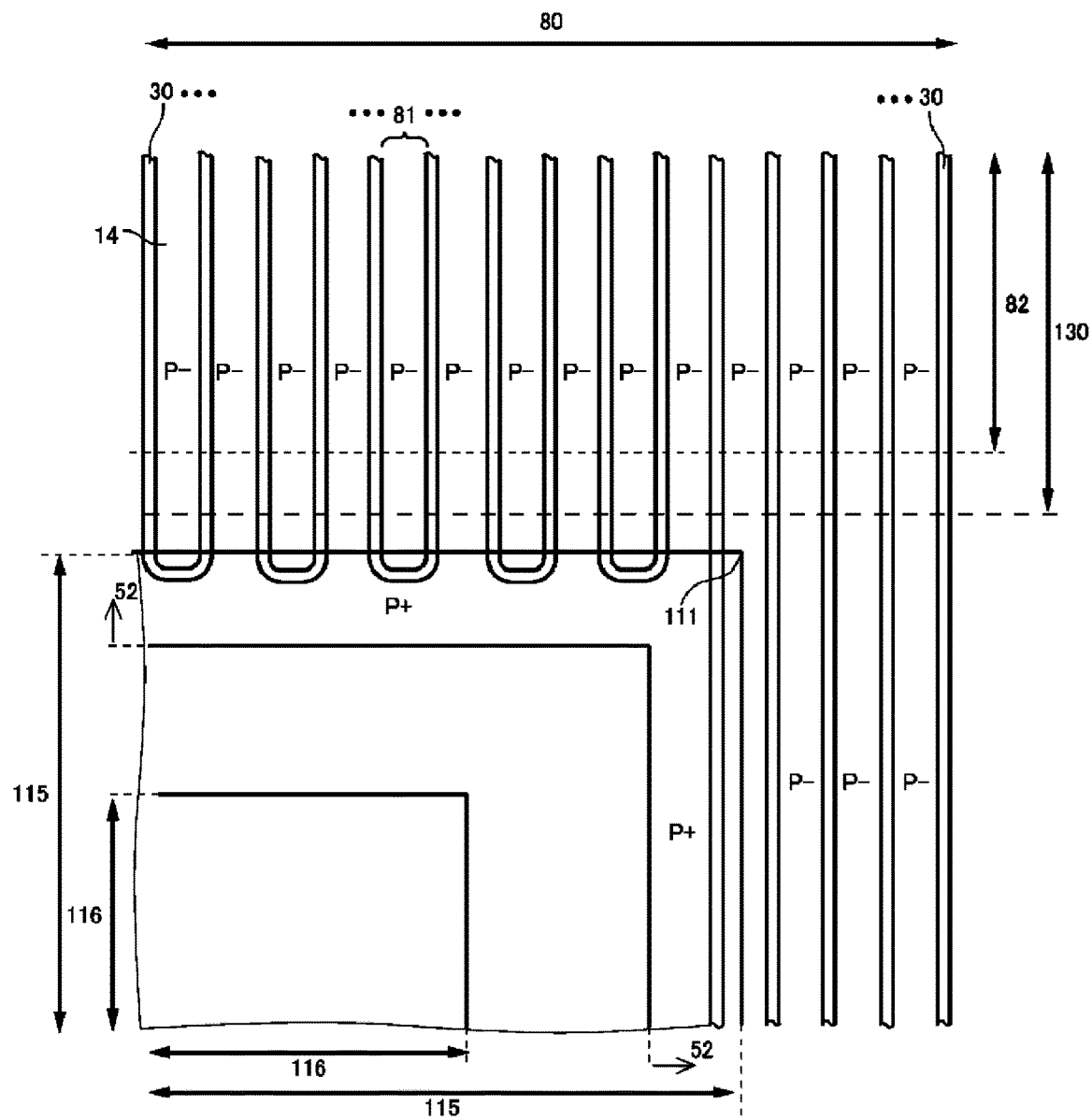
FIG. 2C shows an enlarged view of the upper surface of the semiconductor device 100.

FIG. 2C shows an enlarged view of the upper surface of the semiconductor device 100. The semiconductor device 100 of the present example is an example of a case where the corner portion 111 is provided in the diode portion 80. The dummy trench portions 30 extend to the inner side of the well region 115. That is, end portions of the dummy trench portions 30 on the negative side in the Y axis direction are positioned inside the well region 115.

The corner portion 111 is positioned at the diode portion 80 in a top view. The corner portion 111 of the present example is provided adjacent to the base region 14 between the two adjacent dummy trench portions 30. By covering the vicinity of the corner portion 111 by the diode portion 80 in the semiconductor device 100 of the present example, current crowding in the vicinity of the corner portion 111 can be suppressed.

Figure 2D:
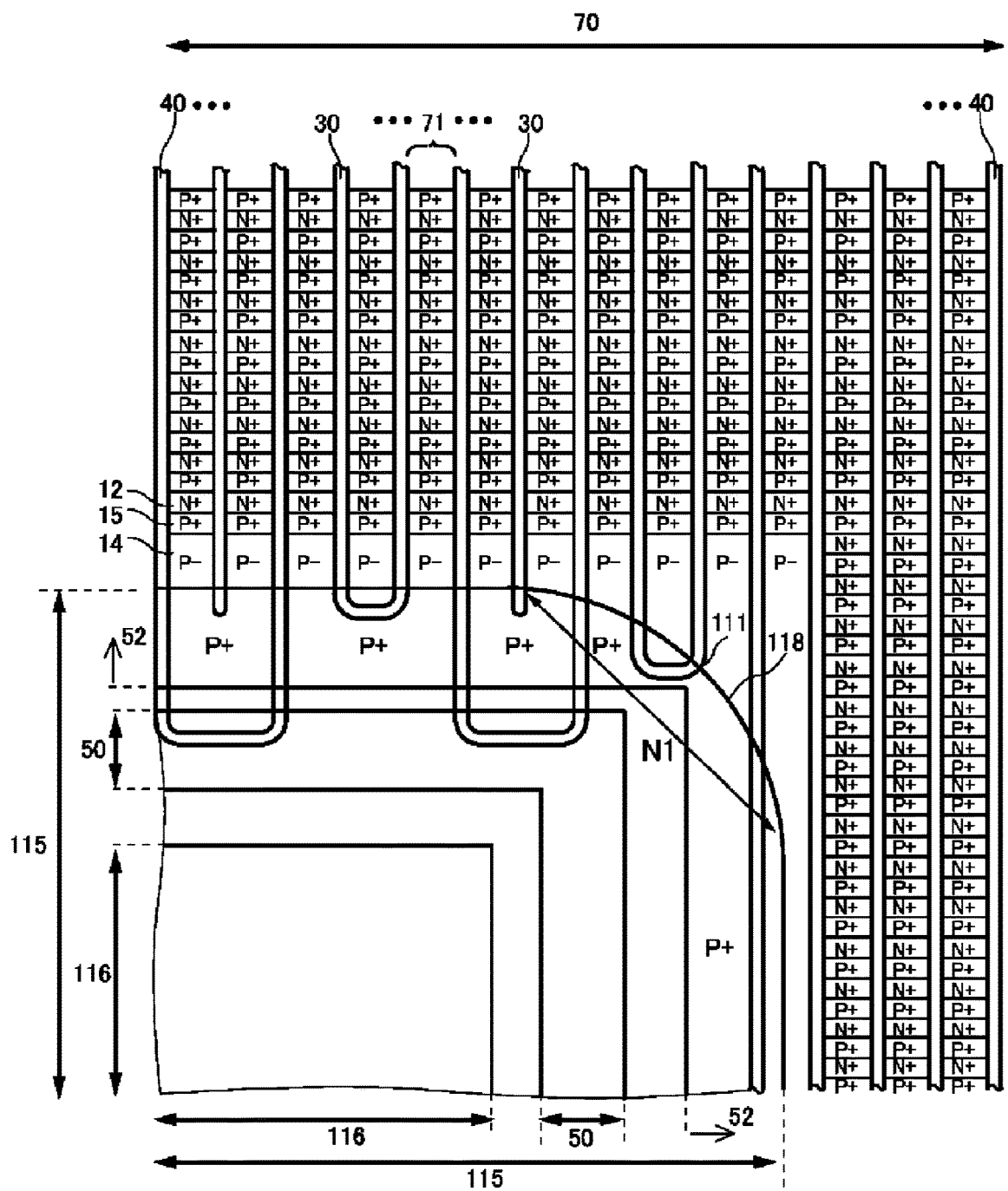
FIG. 2D shows an example of a configuration of the semiconductor device 100 including a notch 118.

FIG. 2D shows an example of the configuration of the semiconductor device 100 including a notch 118. The notch 118 of the present example is provided in the well region 115. The corner portion 111 of the present example is positioned at the transistor portion 70 in a top view.

The notch 118 is a region obtained by partially cutting out the corner of the well region 115 in a top view. The notch 118 of the present example is shaped by cutting out the corner of the well region 115 in an arc, but the shape of the notch 118 is not limited to the present example. When the well region 115 includes the notch 118, a position that protrudes most outwardly in the arc of the notch 118 may be set as the corner portion 111. By providing the notch 118, the distance between the well region 115 and the trench center position TP can be set large. Accordingly, it becomes more easier to avoid a destructive failure of the semiconductor device 100.

A notch length N1 is a distance between end portions of a region where the notch 118 is formed in the well region 115. The notch length N1 may be 10 µm or more, 30 µm or more, 50 µm or more, or 100 µm or more. The notch length N1 may be 1,000 µm or less, 500 µm or less, or 200 µm or less. As an example, the notch length N1 is 100 µm. By increasing the notch length N1, an increase of the electric field intensity in the vicinity of the corner portion 111 is suppressed. Accordingly, an enhancement of an avalanche breakdown due to a current filament can be suppressed. A curvature radius of the notch 118 may be 10 µm or more, 20 µm or more, 50 µm or more, or 100 µm or more. The curvature radius of the notch 118 may be 1,000 µm or less, 500 µm or less, or 200 µm or less.

Figure 2E:
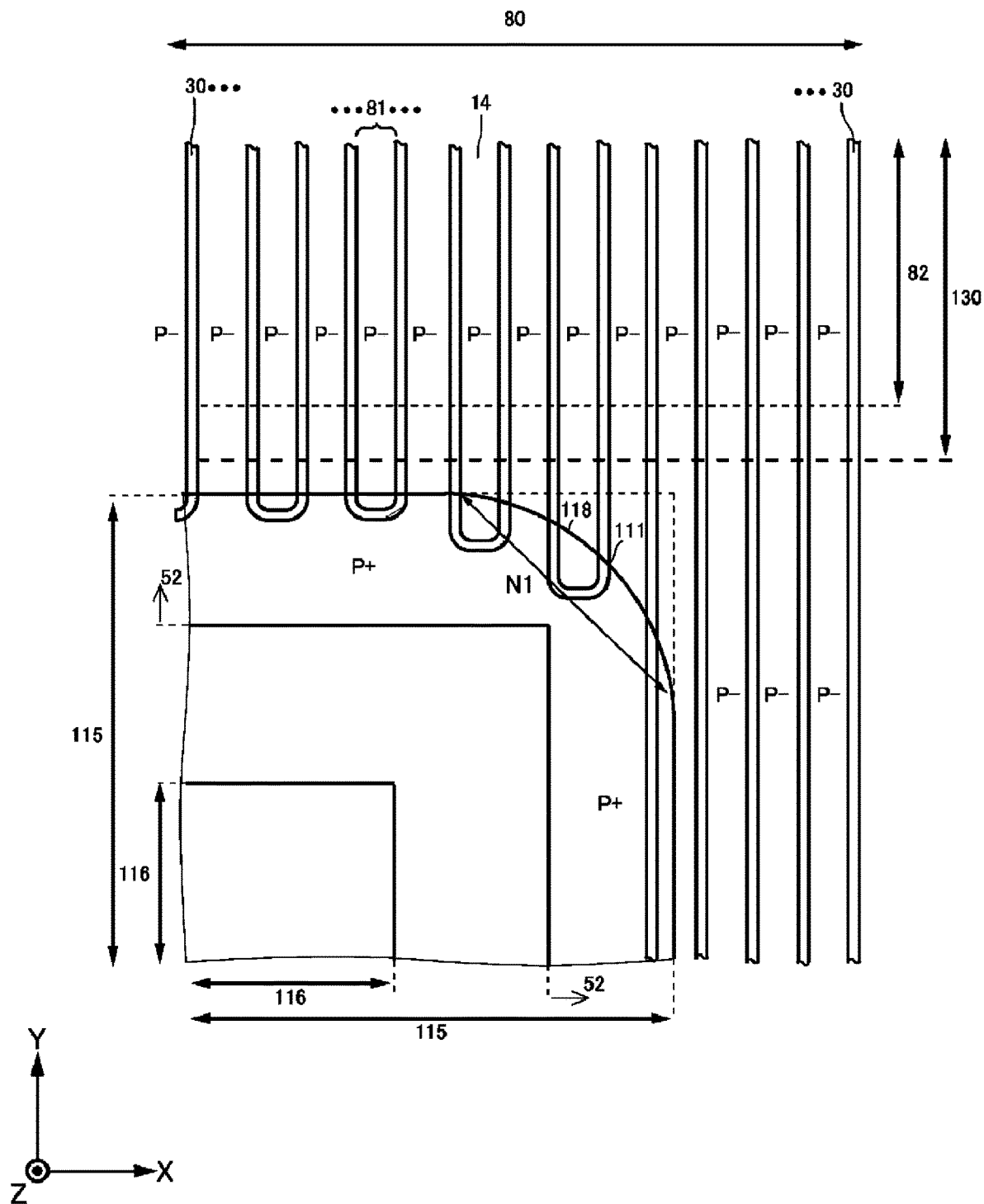
FIG. 2E shows an example of the configuration of the semiconductor device 100 including the notch 118.

FIG. 2E shows an example of the configuration of the semiconductor device 100 including the notch 118. The notch 118 of the present example is provided in the well region 115. The corner portion 111 of the present example is positioned at the diode portion 80 in a top view. The shape of the notch 118 may be similar to that of the example shown in FIG. 2D. Since the notch 118 of the present example is positioned at the diode portion 80, it becomes more easier to increase the distance between the well region 115 and the trench center position TP and thus avoid a destructive failure of the semiconductor device 100.

Note that although the structure in the vicinity of the corner portion 111 of the well region 115 has been described with reference to FIGS. 2A to 2E, a similar structure may be provided also for the corner portion 121 of the well region 125. That is, the corner portion 121 may be positioned at the transistor portion 70, the dummy trench region 172, or the diode portion 80. Further, the corner portion 111 shown in FIGS. 2A to 2E may either be the corner portion 111a or the corner portion 111b.

Figure 3:
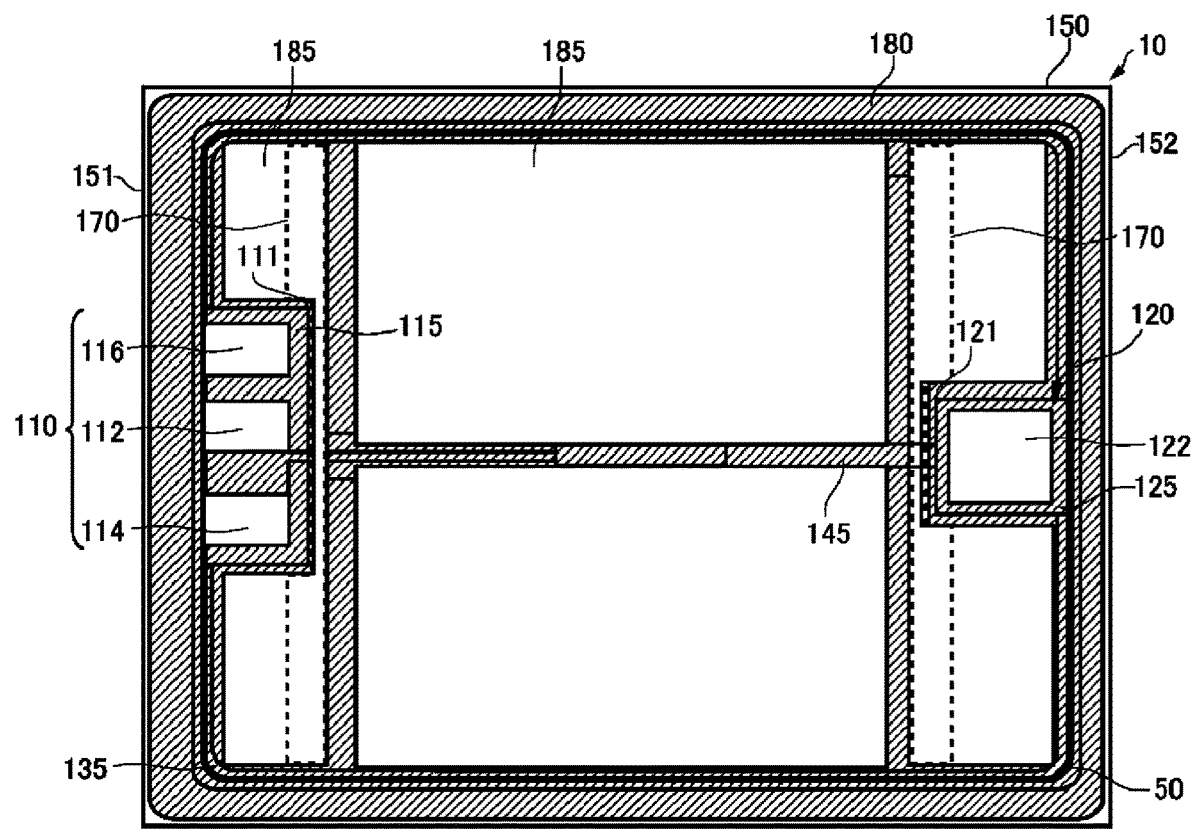
FIG. 3 shows an example of the top view of the semiconductor device 100 in which a protective film 180 is provided.
Figure 3:
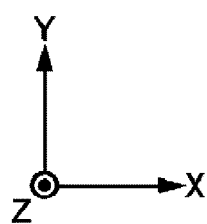

FIG. 3 is an example of a top view of the semiconductor device 100 in which a protective film 180 is provided. The semiconductor device 100 of the present example includes invalid regions 170.

The invalid regions 170 are regions that do not function as the transistor portion 70. The invalid region 170 may be the dummy trench region 172 or the diode portion 80. By providing the invalid region 170 in a periphery of the corner portion 111, an inflow of a current filament to the well region 115 can be suppressed. The invalid region 170 of the present example is also provided in a periphery of the corner portion 121, and thus an inflow of the current filament to the well region 125 can be suppressed.

The protective film 180 is provided above the semiconductor substrate 10. For example, the protective film 180 is an insulation protective film formed of polyimide or the like. The protective film 180 prevents solders on a pad from flowing into other pads or the like. The protective film 180 is provided in regions where the transistor portions 70 are formed in a top view. In other words, the protective film 180 may be provided while avoiding the invalid regions 170. For example, the protective film 180 is provided while avoiding the diode portions 80 in a top view. In the present example, the regions where the protective film 180 is provided are hatched.

Unprotected regions 185 are regions where the protective film 180 is not provided in a top view. In the unprotected regions 185, the front surface electrodes such as the emitter electrode 52 may be exposed. At least one of the transistor portion 70, the diode portion 80, or the dummy trench region 172 may be formed in the unprotected region 185. Note that the unprotected regions 185 are not hatched.

Herein, the lifetime control region 130 of the diode portion 80 may be formed after forming the protective film 180. However, when the protective film 180 is provided above the diode portion 80, it may become difficult to control the position of the lifetime control region 130 in the depth direction due to the protective film 180. By providing the protective film 180 of the present example while avoiding the diode portion 80, the position of the lifetime control region 130 in the depth direction can be controlled accurately.

Figure 4A:
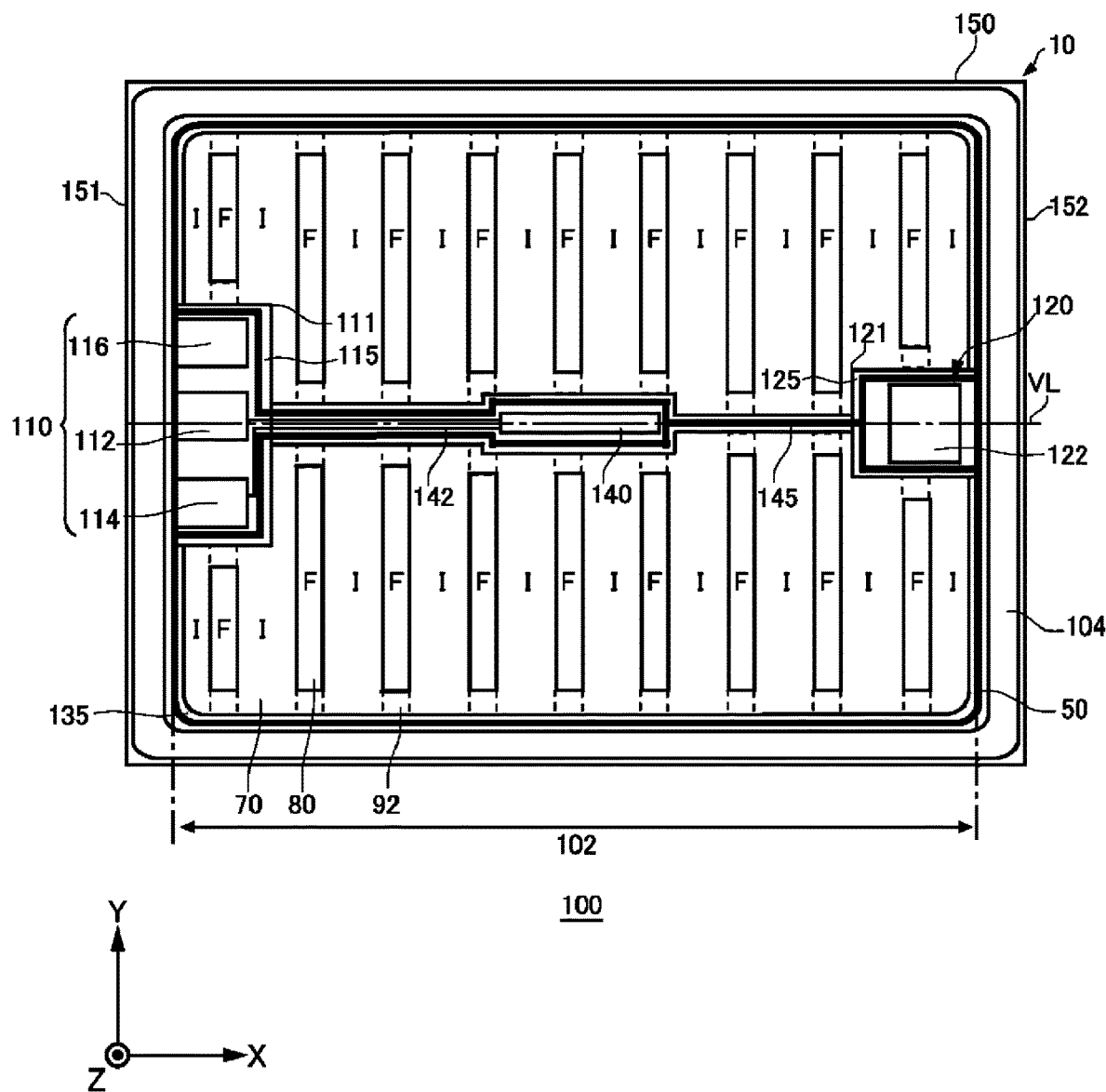
FIG. 4A shows an example of the top view of the semiconductor device 100 according to an example.

FIG. 4A is an example of a top view of the semiconductor device 100 according to an example. The semiconductor device 100 of the present example is different from the semiconductor device 100 shown in FIG. 1A in the point of including the well region 115 provided symmetrically with respect to the center virtual line VL. The well region 115 is symmetric with respect to the center virtual line VL in the extending direction. Accordingly, the shortest distance R1 between the well region 115 and the trench center position TP can be set large.

Figure 4B:
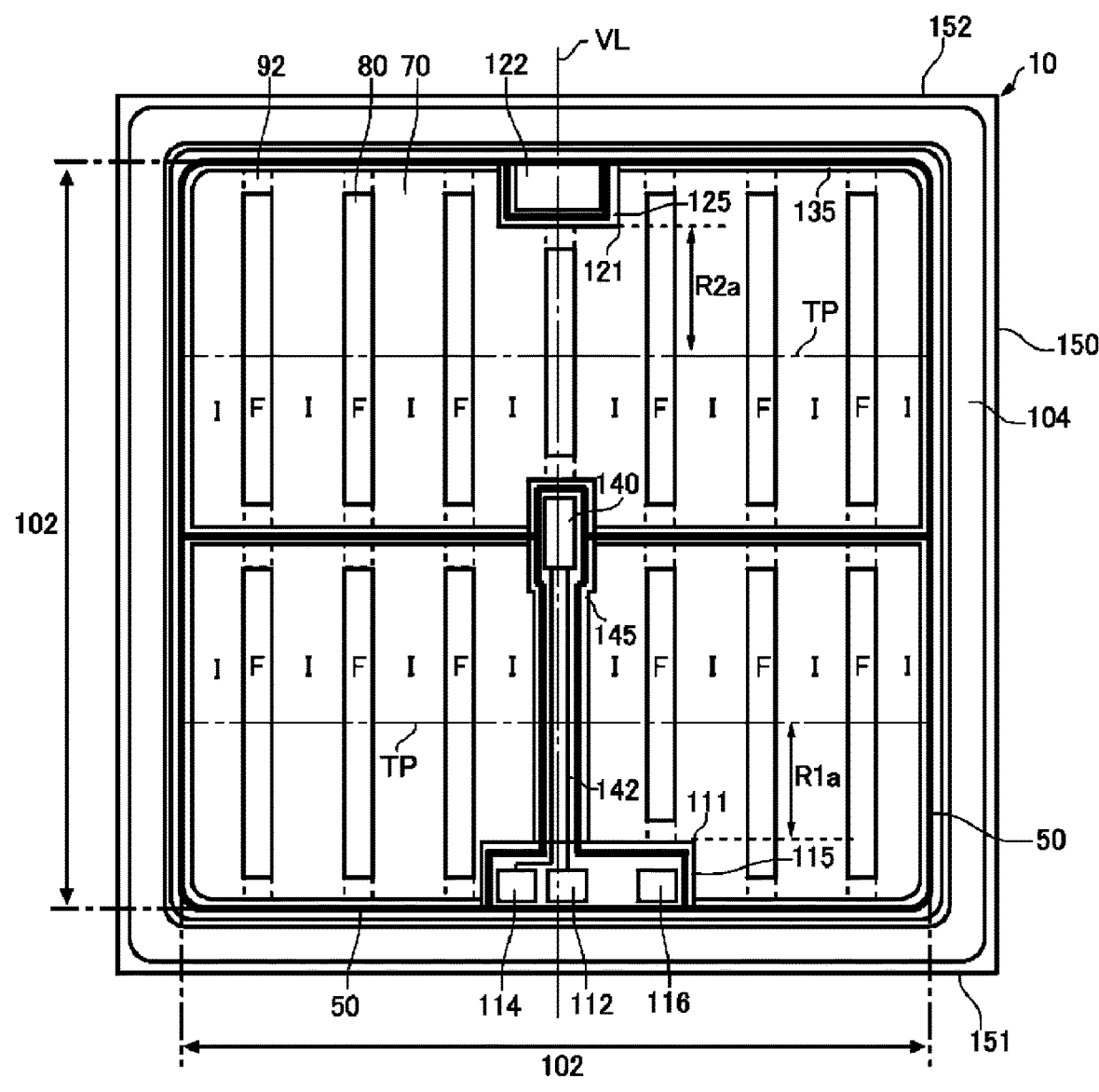
FIG. 4B shows an example of the top view of the semiconductor device 100 according to an example.
Figure 4B:
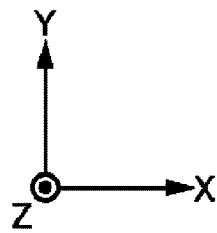

FIG. 4B is an example of a top view of the semiconductor device 100 according to an example. The semiconductor device 100 of the present example is different from that of the example shown in FIG. 1A in that a positional relationship between a position at which the control pad is provided and the extending direction of the trench portions differs.

The first control pad 110 protrudes toward the inner side of the semiconductor substrate 10 from the first outer peripheral side 151 extending in the X axis direction. The second control pad 120 protrudes toward the inner side of the semiconductor substrate 10 from the second outer peripheral side 152 extending in the X axis direction.

The plurality of trench portions extend in the extending direction (Y axis direction) in a top view. That is, the extending direction of the present example is orthogonal to the first outer peripheral side 151 in a top view. Thus, the plurality of trench portions have the extending direction in a direction that is the same as a protrusion direction of the first control pad 110 and the second control pad 120 (Y axis direction). Also in this case, the shortest distance R1a between the corner portion 111 and the trench center position TP satisfies a condition similar to those of the other examples, and thus current crowding in the corner portion 111 can be avoided. Similarly, the shortest distance R2a between the corner portion 121 and the trench center position TP satisfies a condition similar to those of the other examples, and thus current crowding in the corner portion 121 can be avoided.

Figure 5:
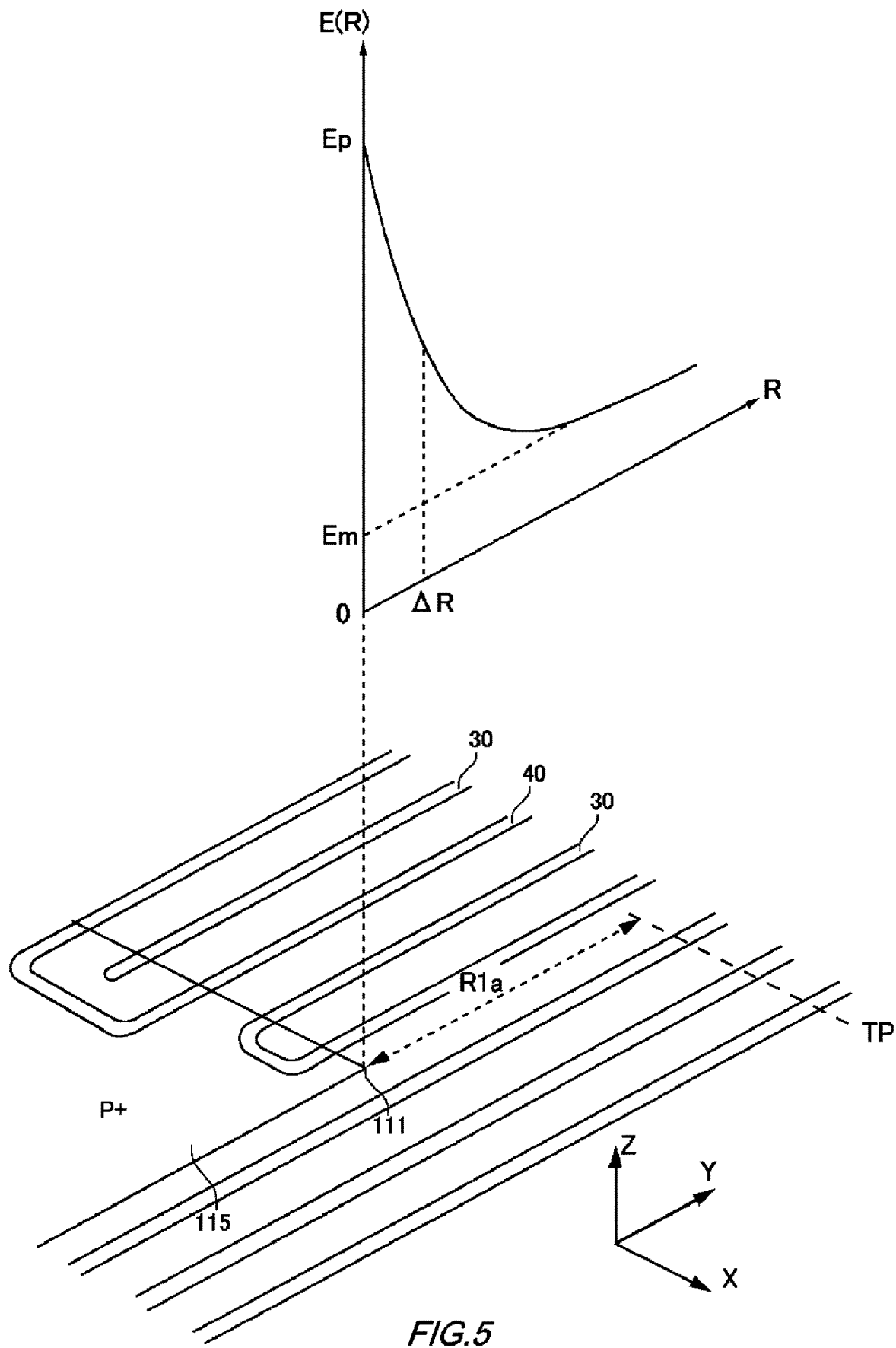
FIG. 5 is a schematic diagram showing an electric field intensity E(R) obtained when an avalanche breakdown occurs in a vicinity of a corner portion 111 in an OFF state.

FIG. 5 is a schematic diagram showing an electric field intensity E(R) when an avalanche breakdown is caused in the vicinity of the corner portion 111 in an OFF state. E(R) indicates an electric field intensity at a position apart by a distance R from the corner portion 111. R is not limited to the direction according to FIG. 5 and may be any direction within a plane (x-y plane in figure) in a top view. R of the present example indicates a distance from the corner portion 111 in the trench extending direction. At a position sufficiently apart from the corner portion 111, the electric field intensity E(R) converges at a maximum electric field intensity Em calculated by a planar junction approximation irrespective of an effect of the corner portion 111 of the well region. As the distance R approaches the corner portion 111, the electric field intensity increases according to a Poisson equation expressed by Expression (1) by the effect of the corner portion 111 of the well region 115.

$$divE = (q/(\varepsilon_0 \varepsilon_r))(p + N_D) \tag{1}$$

Herein, q represents an elementary charge, $\varepsilon_0$ represents a vacuum permittivity, $\varepsilon_r$ represents a relative permittivity, p represents a hole concentration, and $N_D$ represents a donor concentration. E is an electric field (vector), and |E|=E is obtained. In the case of turn-off, an electron concentration and an acceptor concentration inside a depletion layer of the drift region 18 are disregarded since they are sufficiently small. That is, in the vicinity of the corner portion 111, a gradient of the electric field intensity E (divE) increases by a curve of the electric field within the x-y plane on the upper surface. Therefore, the electric field intensity E itself also increases. Thus, E(R) increases from Em as it approaches the corner portion 111.

By the descriptions above, it is considered that the electric field intensity E(R) follows an exponent function. When reaching a peak electric field intensity Ep in the corner portion 111, the electric field intensity E(R) is expressed by the following expression.

$$E(R)=Ep \times \exp(-R/\Delta R)+Em \qquad \text{Expression (2)}$$

Ep represents a peak electric field intensity in the corner portion 111, and $\Delta R$ represents a characteristic length at which the electric field intensity decays. As an example, Ep may be a critical electric field intensity. In the present example, Ep is 6E5 (V/cm). As an example, $\Delta R$ is about 200 µm to 400 µm. $\Delta R$ of the present example is 300 µm. Note that $\Delta R$ is not limited to this range.

When there is no distortion of the electric field within the x-y plane, E(R) becomes a planar junction approximation value Em. When an average donor concentration of a drift layer is represented by $N_{D0}$ and an application voltage is represented by V, Em is expressed by the following expression according to the Poisson equation.

$$Em=[2V(q/\varepsilon_0\varepsilon_r)(p+N_{D0})]^{0.5} \qquad \text{Expression (3)}$$

For the hole concentration p, a case of turn-off of the transistor portion 70 is assumed, for example, and herein, a case where a current of about a rated current $J_{rate}$ flows is assumed. Since a voltage is applied in the turn-off, a speed of holes in the depletion layer (i.e., space-charge region) may be assumed to be saturated at $v_{sat}$, and the hole concentration p satisfies the following Expression (4).

$$p=J_{rate}/(qv_{sat}) \qquad \text{Expression (4)}$$

$v_{sat}$ is $8 \times 10^6$ (cm/s) for holes in silicon, for example. In the present example, $N_{D0}$=5E13/cm³, the application voltage V=600 V, the rated current density $J_{rate}$=500 A/cm², and Em=2.83E5 (V/cm).

Figure 6A:
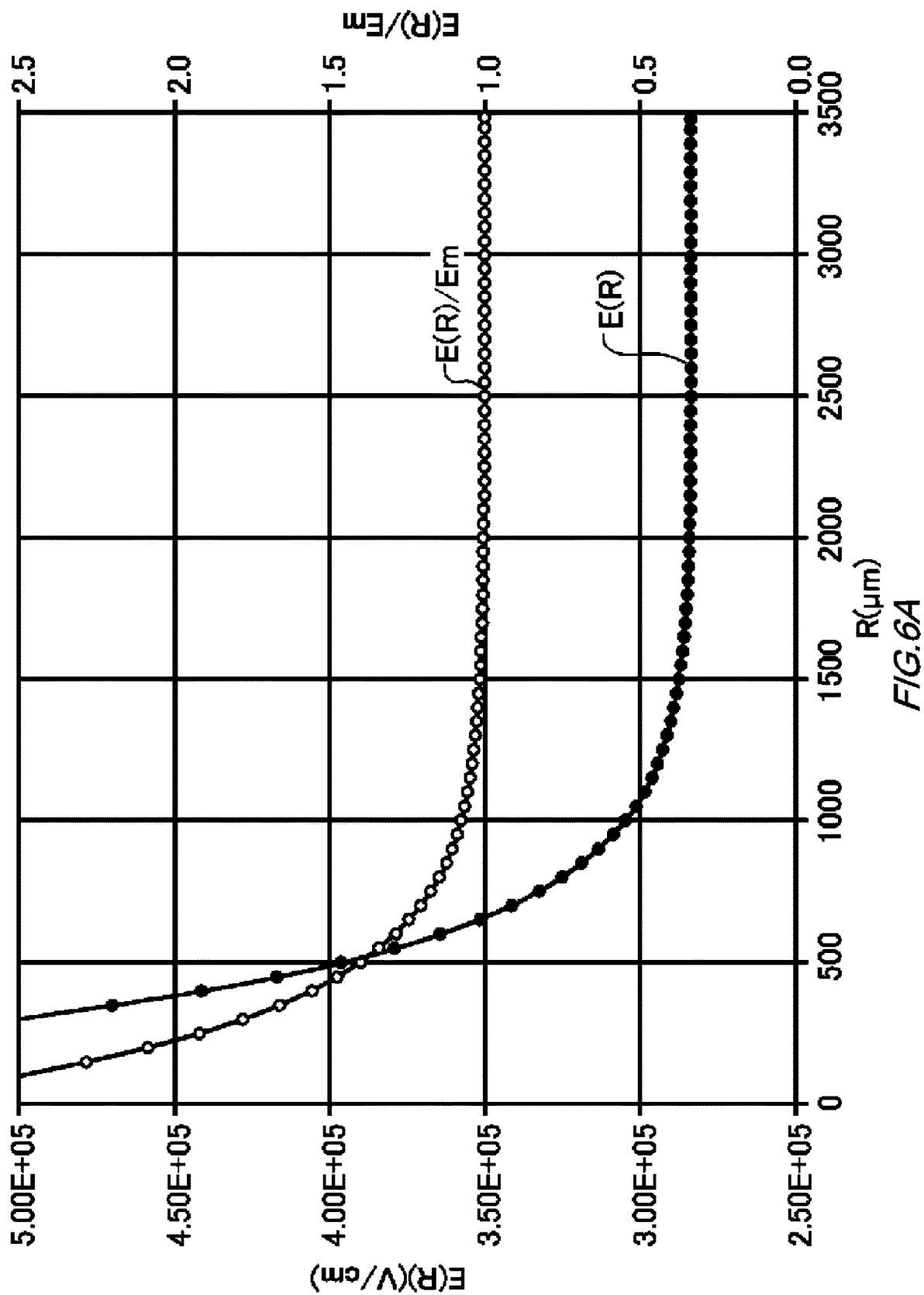
FIG. 6A illustrates a shortest distance R dependency of the electric field intensity in the vicinity of the corner portion 111.

FIG. 6A illustrates a distance R dependency of the electric field intensity E(R) at the position apart by the distance R from the corner portion 111. A longitudinal axis represents a ratio E(R)/Em normalized by the electric field intensity E(R) (V/cm) and the maximum electric field intensity Em, and a horizontal axis represents the distance R (µm) from the corner portion 111.

The electric field intensity E(R) shows an electric field intensity of about the maximum electric field intensity Em in a range in which the distance R is 1,500 µm or more. On the other hand, the electric field intensity E(R) increases sharply as the distance R becomes smaller than 1,500 µm. When the distance R becomes smaller than 1,500 µm, the electric field intensity ratio E(R)/Em becomes 1.1 or more. The avalanche breakdown is a critical phenomenon, and an impact ionization coefficient strongly depends on the electric field intensity. Therefore, when the electric field intensity ratio E(R)/Em becomes 1.1 times or more, the impact ionization coefficient becomes twice or more, with the result that an impact ionization rate increases and a strong avalanche breakdown occurs. The electric field intensity ratio E(R)/Em becomes 1.1 or more when the distance R is smaller than 1,000 µm. That is, in a region where the distance R is smaller than 1,000 µm, the avalanche breakdown is likely to occur as compared to a region where the distance R is 1,000 µm or more. Further, when the distance R is 1,500 µm or more, the electric field intensity ratio E(R)/Em becomes 1.01 or less. That is, in a region where the distance R is 1,500 µm or more, an increase of the electric field intensity due to a spatial distortion (curve) of the electric field is considered to be sufficiently small. By the descriptions above, the impact ionization rate of the avalanche breakdown becomes high in a region where the distance R is smaller than 1,000 µm. In the present example, a highest value is obtained in the corner portion 111 (R=0).

Herein, the distance R may be replaced with the shortest distance R1a from the corner portion 111 to the trench center position TP. That is, the shortest distance R1a from the corner portion 111 to the trench center position TP may be 1,000 µm or more or 1,500 µm or more. Note that although the distance R is replaced with the shortest distance R1a in the descriptions of the present example, the distance R can also be replaced with the shortest distance R1b, R2a, or R2b.

When the gate voltage is turned off from + to − during turn-off, the potential is transmitted from the gate metal layer 50 to the gate conductive portion 44. When the gate conductive portion 44 is formed of polysilicon, a resistivity is lower than that of an aluminum alloy or the like. On the other hand, charge/discharge of a MOS capacitor is necessary for eliminating (or generating) a MOS gate inversion layer. In the charge/discharge of the MOS capacitor, a delay time is generated by an electrostatic capacity determined based on the thickness of the gate dielectric film 42 and a resistance of the gate conductive portion 44. As a length from the position of the gate metal layer 50 to the trench center position TP increases, the resistance of the gate conductive portion 44 increases. Thus, a delay time required for charging the MOS capacitor at the trench center position TP becomes long. Due to this increase of the delay time, a timing of turning off the gate in the vicinity of the trench center position TP is delayed, and thus carriers are concentrated at the trench center position TP to cause a current filament. On the other hand, the depletion layer spreads in the drift region 18 during turn-off, and the current filament exists in the depletion layer. Since many carriers (holes) remain in the current filament, the gradient of the electric field intensity of the depletion layer increases, and the electric field intensity increases. Further, since the current density (hole current in particular) is large, the impact ionization rate also increases, and the avalanche breakdown is enhanced.

When the trench center position TP is positioned in a region apart by a distance smaller than 1,000 µm from the corner portion 111, the shortest distance R1a becomes smaller than 1,000 µm. In this case, during turn-off, the electric field intensity E (R1a) at the trench center position TP becomes larger than 1.1 times of Em. Thus, at the trench center position TP, not only the current filament but also the spatial distortion of the electric field causes an increase of the electric field intensity. Consequently, the impact ionization rate increases not only in the vicinity of the corner portion 111 but also at the trench center position TP, and thus the avalanche breakdown is likely to occur. As a result, a positive feedback of currents occurs in the region including the corner portion 111 and the trench center position TP, and a possibility of resulting in a destructive failure becomes high. Thus, by setting the shortest distance R1a to become larger than 1,000 μm, the distance R of the trench center position TP from the corner portion 111 becomes 1,000 μm or more. Accordingly, it becomes possible to set the electric field intensity E (R1a) to become smaller than 1.1 times of Em, suppress enhancement of the avalanche breakdown at the corner portion 111 and the trench center position TP, and thus prevent a destructive failure during turn-off. In addition, the shortest distance R1a may be set to be 1,500 μm or more.

Further, since the width Wg of the gate conductive portion 44 becomes smaller and the trench length Lt becomes larger as the conductive portion shape ratio α increases, the resistance of the gate conductive portion 44 from the position of the gate metal layer 50 to the trench center position TP increases. That is, a delay time is generated during charge/discharge of the gate conductive portion 44 in the vicinity of the trench center position TP, and a current filament is likely to be generated. Thus, within the range of the conductive portion shape ratio α described above, the shortest distance R1a is set to be 1,000 μm or more. Accordingly, it becomes possible to suppress enhancement of the avalanche breakdown at the corner portion 111 and the trench center position TP and prevent a destructive failure during turn-off. The shortest distance R1a may be 1,500 μm or more, 2,000 μm or more, 3,000 μm or more, or 5,000 μm or more. The shortest distance R1a may be 20,000 μm or less, 15,000 μm or less, or 10,000 μm or less.

Figure 6B:
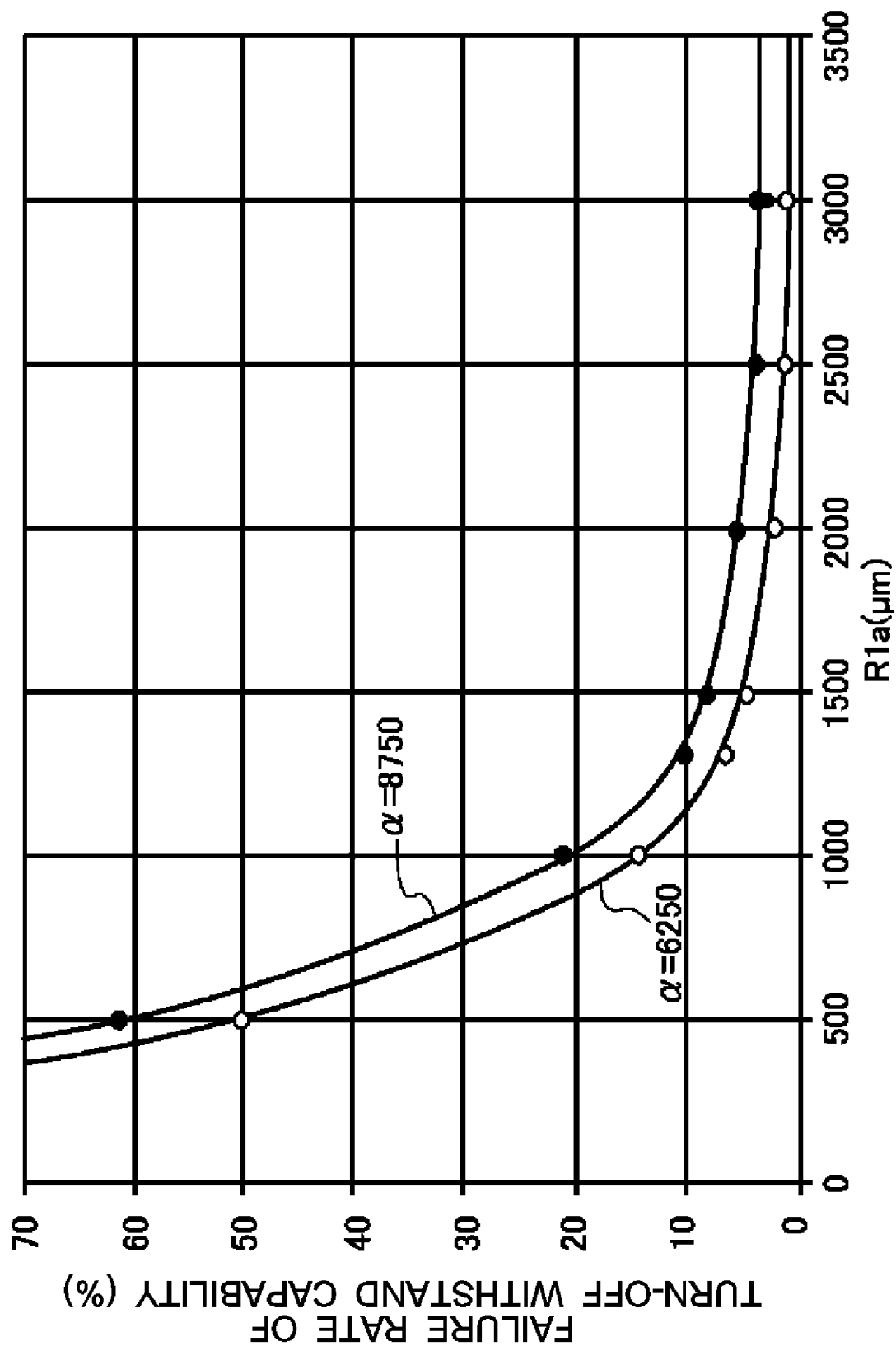
FIG. 6B is a graph showing a relationship between a shortest distance R1$a$ and a failure rate of a turn-off withstand capability (%).

FIG. 6B is a graph showing a relationship between the shortest distance R1a and a failure rate of a turn-off withstand capability (%). The failure rate of the turn-off withstand capability is a percentage of a destructive failure of the semiconductor device by the turn-off. The turn-off current density and application voltage may vary, and the conditions described above may be used as an example. In the present example, the failure rates of the turn-off withstand capability in a case where the conductive portion shape ratio α is 6,250 and a case where the conductive portion shape ratio α is 8,750 are shown.

When the conductive portion shape ratio α is 6,250, the trench length Lt is 5,000 μm, and the width Wg of the gate conductive portion 44 is 0.8 μm. When the shortest distance R1a is 500 μm, the failure rate of the turn-off withstand capability is 50%. The failure rate decreases to 14% when the shortest distance R1a is 1,000 μm, decreases to 5% when the shortest distance R1a is 1,500 μm, and decreases to 2% when the shortest distance R1a is 2,000 μm.

When the conductive portion shape ratio α is 8,750, the trench length Lt is 7,000 μm, and the width Wg of the gate conductive portion 44 is 0.8 μm. When the shortest distance R1a is 500 μm, the failure rate of the turn-off withstand capability is 62% and decreases to 21% when the shortest distance R1a is 1,000 μm. Further, the failure rate largely decreases to 8% or less when the shortest distance R1a is 1,500 μm or more. Since the failure rate of the turn-off withstand capability can be set to be smaller than 30%, the shortest distance R1a may be 1,000 μm or more, 1,500 μm or more, 2,000 μm or more, 3,000 μm or more, or 5,000 μm or more. Note that although the shortest distance R1a has been described in the present example, the same holds true for the shortest distance R1b, R2a, or R2b.

Figure 6C:
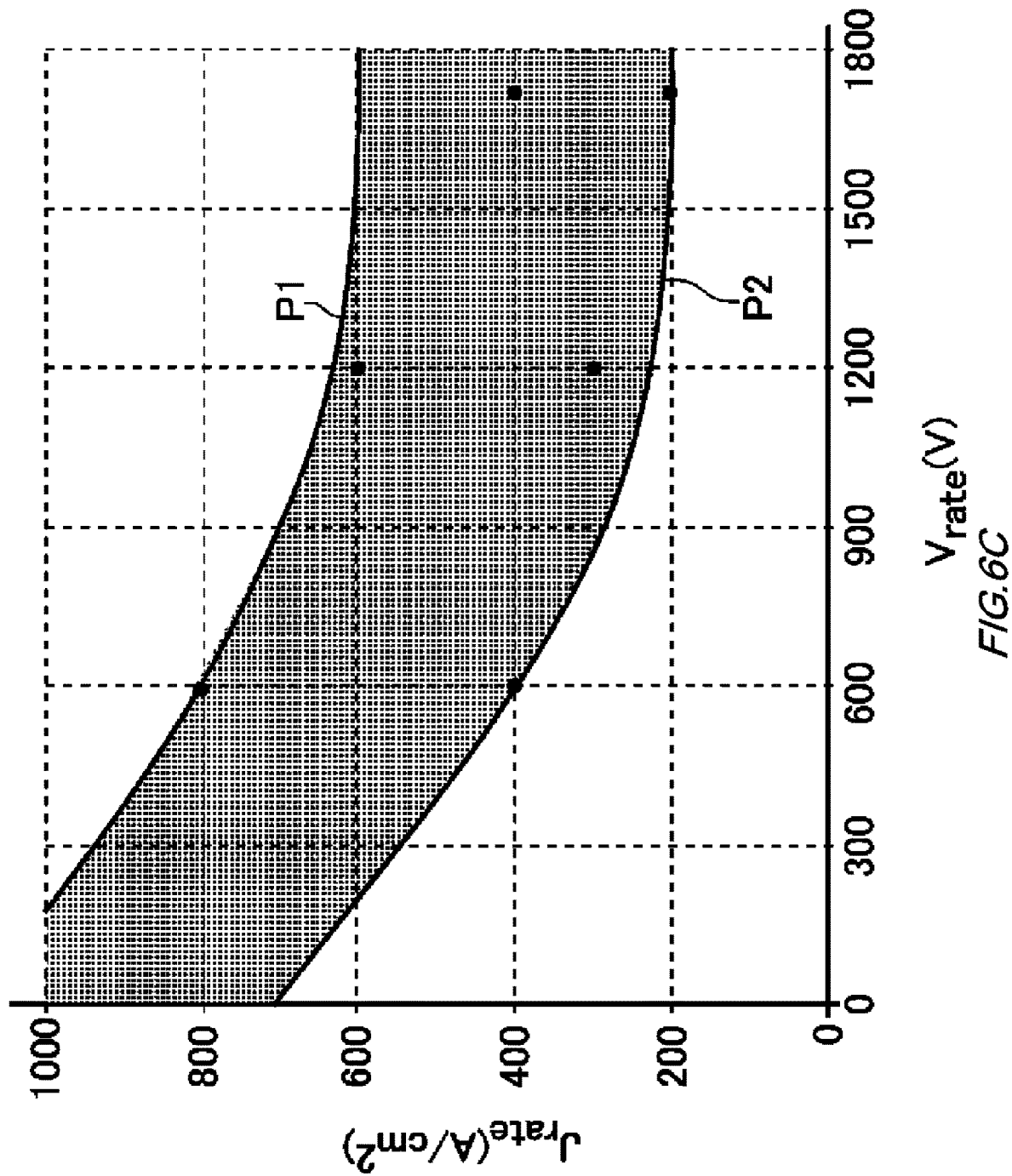
FIG. 6C is a graph showing a relationship between a rated voltage Vrate and a rated current density Jrate.

FIG. 6C is a graph showing a relationship between the rated voltage $V_{rate}$ and the rated current density $J_{rate}$. A longitudinal axis represents the rated current density $J_{rate}$ (A/cm$^2$), and a horizontal axis represents the rated voltage (V). As an example, the semiconductor device 100 may be designed to satisfy the rated voltage $V_{rate}$ and the rated current density $J_{rate}$ in a region sandwiched by an upper limit P1 and a lower limit P2 in FIG. 6C.

For example, the semiconductor device 100 may be designed to satisfy the rated current density of 400 (A/cm$^2$) or more and 800 (A/cm$^2$) or less at a rated voltage of 600 (V). Further, the semiconductor device 100 may be designed to satisfy the rated current density of 300 (A/cm$^2$) or more and 600 (A/cm$^2$) or less at a rated voltage of 1,200 (V). The semiconductor device 100 may be designed to satisfy the rated current density of 200 (A/cm$^2$) or more and 400 (A/cm$^2$) or less at a rated voltage of 1,700 (V).

In the semiconductor device 100 of the present example, even when the trench length Lt is set to be 2,000 μm or more for realizing such characteristics, by appropriately setting the distance between the P type well region and the trench center position TP, a destructive failure of a device due to an inflow of a current filament to the P type well region can be avoided.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device, comprising:
    an active portion provided on a semiconductor substrate;
    a plurality of trench portions each including a gate conductive portion and arranged in a predetermined array direction while extending in a predetermined extending direction in the active portion, a conductive portion shape ratio of a trench length in the extending direction to a width of the gate conductive portion in the array direction being 1,000 or more;
    a first control pad protruding toward an inner side of the semiconductor substrate from a predetermined first outer peripheral side of the semiconductor substrate in a top view; and
    a first well region provided below the first control pad, the first well region being provided to cover the first control pad in the top view,
    wherein
    a shortest distance between the first well region and a trench center position as a center of a length of the plurality of trench portions in the extending direction in the top view is 1,000 μm or more.

2. The semiconductor device according to claim 1, wherein
    the shortest distance is 1,500 μm or more.

3. The semiconductor device according to claim 1, wherein
    the shortest distance is 2,000 μm or more.

4. The semiconductor device according to claim 1, wherein the conductive portion shape ratio of the plurality of trench portions is 3,000 or more and $1\times10^6$ or less.

5. The semiconductor device according to claim 1, wherein
the plurality of trench portions include a gate trench portion set at a gate potential, and
the conductive portion shape ratio of the gate trench portion is 5,000 or more and $3\times10^5$ or less.

6. The semiconductor device according to claim 1, wherein
the first control pad includes an anode pad, a cathode pad, and a sense pad.

7. The semiconductor device according to claim 1, wherein
the first well region is rectangular in the top view, and three sides of the first well region oppose the active portion.

8. The semiconductor device according to claim 1, wherein
the first well region includes a corner portion protruding from the first outer peripheral side, and
the shortest distance is a distance between the corner portion of the first well region and the trench center position.

9. The semiconductor device according to claim 8, wherein
a distance L1$a$ from a center virtual line to the corner portion of the first well region, the center virtual line being orthogonal to the first outer peripheral side and passing a center of the first outer peripheral side, is 40% or more of a length from the center virtual line to an outer peripheral edge of the semiconductor substrate in a direction orthogonal to the center virtual line.

10. The semiconductor device according to claim 9, comprising:
a second control pad protruding toward the inner side of the semiconductor substrate from a second outer peripheral side opposing the first outer peripheral side in the top view; and
a second well region provided below the second control pad, the second well region being provided to cover the second control pad in the top view,
wherein
the second well region includes a corner portion protruding from the second outer peripheral side, and
the distance L1$a$ is longer than a distance L2$a$ from the center virtual line to the corner portion of the second well region in the extending direction.

11. The semiconductor device according to claim 10, wherein
the second control pad includes a gate pad for setting the plurality of trench portions at a gate potential.

12. The semiconductor device according to claim 1, wherein
the first well region is symmetric with respect to a center virtual line, the center virtual line being orthogonal to the first outer peripheral side and passing a center of the first outer peripheral side.

13. The semiconductor device according to claim 1, wherein
the first well region is asymmetric with respect to a center virtual line, the center virtual line being orthogonal to the first outer peripheral side and passing a center of the first outer peripheral side.

14. The semiconductor device according to claim 1, wherein
the first well region includes a notch obtained by partially cutting out a corner of the first well region in the top view.

15. The semiconductor device according to claim 1, wherein
the active portion includes a transistor portion and a diode portion, and
a corner portion of the first well region is positioned at the transistor portion in the top view.

16. The semiconductor device according to claim 1, wherein
the plurality of trench portions include a dummy trench region set at an emitter potential, and
a corner portion of the first well region is positioned at the dummy trench region in the top view.

17. The semiconductor device according to claim 1, wherein
the active portion includes a transistor portion and a diode portion, and
a corner portion of the first well region is positioned at the diode portion in the top view.

18. The semiconductor device according to claim 17, comprising
a protective film provided above the semiconductor substrate,
wherein
the diode portion includes a lifetime control region on a front surface side of the semiconductor substrate, and
the protective film is provided while avoiding the diode portion in the top view.

19. The semiconductor device according to claim 1, wherein
the extending direction is parallel to the first outer peripheral side in the top view.

20. The semiconductor device according to claim 1, wherein
the extending direction is orthogonal to the first outer peripheral side in the top view.

* * * * *